United States Patent
Kishi et al.

(10) Patent No.: US 9,443,471 B2
(45) Date of Patent: Sep. 13, 2016

(54) DISPLAY DEVICE AND DRIVING METHOD THEREOF

(71) Applicant: Sharp Kabushiki Kaisha, Osaka (JP)

(72) Inventors: Noritaka Kishi, Osaka (JP); Masanori Ohara, Osaka (JP); Noboru Noguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 83 days.

(21) Appl. No.: 14/411,374

(22) PCT Filed: Jul. 24, 2013

(86) PCT No.: PCT/JP2013/069985
§ 371 (c)(1),
(2) Date: Dec. 24, 2014

(87) PCT Pub. No.: WO2014/021150
PCT Pub. Date: Feb. 6, 2014

(65) Prior Publication Data
US 2015/0138183 A1    May 21, 2015

(30) Foreign Application Priority Data

Jul. 31, 2012 (JP) .................................. 2012-170013
Feb. 15, 2013 (JP) .................................. 2013-028286

(51) Int. Cl.
*G09G 5/00*    (2006.01)
*G09G 3/32*    (2016.01)
(Continued)

(52) U.S. Cl.
CPC ............ *G09G 3/325* (2013.01); *G09G 3/3233* (2013.01); *G09G 3/3266* (2013.01);
(Continued)

(58) Field of Classification Search
CPC ...... G09G 3/32; G09G 3/325; G09G 3/3233; G09G 3/3266; G09G 3/3291; G09G 2320/0233

USPC .......................... 345/76–82, 87–98, 204–215
See application file for complete search history.

(56) References Cited

U.S. PATENT DOCUMENTS 7,414,599 B2 * 8/2008 Chung ................. G09G 3/3233
 315/169.3
7,834,826 B2 * 11/2010 Kwon .................. G09G 3/2014
 345/77

(Continued)

FOREIGN PATENT DOCUMENTS

JP    2002-278513 A    9/2002
JP    2005-31630 A    2/2005

(Continued)

OTHER PUBLICATIONS

Hsieh et al., "IGZO TFTs with Good environmental stability and Short Range Uniformity" The 16th International Display Workshop(IDW'09) AMD7-3, pp. 1681-1684, 2009.

(Continued)

*Primary Examiner* — Vijay Shankar
(74) *Attorney, Agent, or Firm* — Morrison & Foerster LLP

(57) ABSTRACT

A gate driver divides n scanning lines (G1 to Gn) into p blocks (BL1 to BLp), and provides for each block, a common selection period for selecting a whole or a part of k scanning lines included in the block, and a scanning period for sequentially selecting k scanning lines included in the block. A source driver (30) detects a characteristic of a driving transistor via a data line from a pixel circuit (11) corresponding to a scanning line that is being selected in the common selection period, and supplies to the data line a corrected data voltage that has been obtained by correcting the data voltage based on the detected characteristic of the driving transistor. Accordingly, there is provided a display device that can compensate for a characteristic variation of the driving transistor while solving a shortage of writing time.

20 Claims, 12 Drawing Sheets

(51) Int. Cl.
*H01L 27/12* (2006.01)
*H01L 51/50* (2006.01)

(52) U.S. Cl.
CPC ....... *G09G 3/3291* (2013.01); *H01L 27/1225* (2013.01); *G09G 2300/0814* (2013.01); *G09G 2300/0819* (2013.01); *G09G 2300/0842* (2013.01); *G09G 2300/0861* (2013.01); *G09G 2300/0876* (2013.01); *G09G 2310/0213* (2013.01); *G09G 2310/0218* (2013.01); *G09G 2310/0291* (2013.01); *G09G 2320/0204* (2013.01); *G09G 2320/029* (2013.01); *G09G 2320/0233* (2013.01); *G09G 2320/0295* (2013.01); *G09G 2320/043* (2013.01); *H01L 51/50* (2013.01)

(56) References Cited

U.S. PATENT DOCUMENTS

| | | | | |
|---|---|---|---|---|
| 8,542,166 | B2* | 9/2013 | Murata | G09G 3/3233 345/76 |
| 8,847,939 | B2* | 9/2014 | Kishi | G09G 3/3233 345/211 |
| 9,202,412 | B2* | 12/2015 | Odawara | G09G 3/3233 |
| 2005/0017934 | A1 | 1/2005 | Chung et al. | |
| 2007/0200804 | A1 | 8/2007 | Kwon | |
| 2008/0303754 | A1 | 12/2008 | Murata et al. | |
| 2009/0122047 | A1 | 5/2009 | Yamamoto et al. | |
| 2010/0045646 | A1 | 2/2010 | Kishi | |
| 2013/0021228 | A1 | 1/2013 | Miwa et al. | |
| 2013/0027383 | A1 | 1/2013 | Odawara et al. | |

FOREIGN PATENT DOCUMENTS

| | | |
|---|---|---|
| JP | 2007-233326 A | 9/2007 |
| JP | 2008-158222 A | 7/2008 |
| JP | 2010-256783 A | 11/2010 |
| JP | 2011-118079 A | 6/2011 |
| JP | 2011-203510 A | 10/2011 |
| JP | 2011-221398 A | 11/2011 |
| TW | 200935384 A | 8/2009 |
| WO | WO-2008/108024 A1 | 9/2008 |

OTHER PUBLICATIONS

International Search Report received for PCT Patent Application No. PCT/JP2013/069985, mailed on Sep. 10, 2013, 4 pages.

* cited by examiner

DISPLAY DEVICE AND DRIVING METHOD THEREOF

CROSS REFERENCE TO RELATED APPLICATIONS

This is a U.S. National Phase patent application of PCT/JP2013/069985, filed Jul. 24, 2013, which claims priority to Japanese patent application no. 2012-170013 filed Jul. 31, 2012 and to Japanese patent application no. 2013-028286 filed Feb. 15, 2013, each of which is hereby incorporated by reference in the present disclosure in its entirety.

TECHNICAL FIELD

The present invention relates to a display device, and more specifically to a display device including a pixel circuit that includes an electro-optic element such as an organic EL (Electro Luminescence) element, and a driving method of the display device.

BACKGROUND ART

As a thin, high image quality, and low power consumption display device, an organic EL display device is known. In the organic EL display device, a plurality of pixel circuits are arranged in a matrix form, each including an organic EL element, which is a current-driven self-luminous type electro-optic element, and a driving transistor.

As the driving transistor, typically, a thin-film transistor (hereinafter, occasionally abbreviated as "TFT") is used, and a characteristic of the TFT tends to easily vary. Such a variation in a characteristic of the driving transistor may cause a brightness variation. The "characteristic of the driving transistor" referred here is a threshold voltage and mobility of the driving transistor, for example.

Conventionally, various organic EL display devices that compensate for a characteristic variation of a driving transistor have been known. Patent Document 1 discloses an organic EL display device that compensates for a variation in the threshold voltage of the driving transistor, by providing in the pixel circuit a transistor that detects a variation in the threshold voltage. Hereinafter, compensating for a variation in the threshold voltage will be occasionally called "threshold voltage compensation". Patent Document 2 discloses an organic EL display device that performs threshold voltage compensation, by providing at the outside of the pixel circuit a circuit that detects the threshold voltage of the driving transistor and that supplies to a data line a voltage corrected based on a result of the detection. Patent Document 3 discloses an organic EL display device that compensates for a characteristic variation of the driving transistor by detecting a driving current which flows to the driving transistor and by controlling a voltage supplied to a data line based on a result of the detection. Patent Document 4 discloses an organic EL display device that compensates for a characteristic variation of the driving transistor by holding, in a memory, characteristic variation information of the driving transistor and by correcting a voltage supplied to a data line, based on the variation information read from the memory.

PRIOR ART DOCUMENTS

Patent Documents

[Patent Document 1] Japanese Laid-Open Patent Publication No. 2005-31630
[Patent Document 2] WO 2008/108024
[Patent Document 3] Japanese Laid-Open Patent Publication No. 2007-233326
[Patent Document 4] Japanese Laid-Open Patent Publication No. 2002-278513

Non-Patent Document

[Non-Patent Document 1] Hsing-Hung Hsieh et al., "IGZO TFTs with Good environmental stability and Short-Range Uniformity", the 16th International Display Workshop (IDW '09) AMD 7-3, pp. 1681-1684, 2009.

SUMMARY OF THE INVENTION

Problems to be Solved by the Invention

Meanwhile, according to the organic EL display device disclosed in Patent Document 1, because the transistor for performing threshold voltage compensation needs to be added to the inside of the pixel circuit, the configuration of the pixel circuit becomes complicated. Further, according to the organic EL display devices disclosed in Patent Documents 2 and 3, writing time is insufficient because it is necessary to perform both detection of the threshold voltage or the driving current and writing of a voltage supplied via the data line (hereinafter, occasionally simply referred to as "writing"). Further, according to the organic EL display device disclosed in Patent Document 4, because the memory for compensation is necessary, the configuration of an external circuit becomes complicated.

Therefore, an object of the present invention is to provide a display device that can compensate for a characteristic variation of a driving transistor while solving a shortage in the writing time, with a simple configuration, and a driving method of the display device.

Means for Solving the Problems

According to a first aspect of the present invention, there is provided an active matrix-type display device including: a display unit including a plurality of data lines, a plurality of scanning lines, and a plurality of pixel circuits disposed corresponding to the plurality of data lines and the plurality of scanning lines; a data driving unit connected to the plurality of data lines; and a scanning driving unit connected to the plurality of scanning lines, wherein the pixel circuit includes: an electro-optic element driven by a current; and a driving transistor that is provided in series with the electro-optic element and that controls a driving current to be supplied to the electro-optic element, in accordance with a voltage supplied via the data line, the scanning driving unit makes each of the scanning lines correspond to any one of one or more blocks, and provides, for each block, a common selection period for selecting a whole or a part of scanning lines corresponding to the block, and a scanning period for sequentially selecting the scanning lines corresponding to the block, and the data driving unit includes: a detecting unit that detects a characteristic of the driving transistor via the data line from a pixel circuit corresponding to a scanning line which is being selected in the common selection period;

and a correction output unit that supplies to the data line a voltage obtained by correcting a data voltage indicating gradation data, based on a characteristic of the driving transistor detected by the detecting unit in the common selection period immediately before the scanning period.

According to a second aspect of the present invention, in the first aspect of the present invention, the scanning driving unit makes each of the scanning lines correspond to any one of a plurality of blocks, and the scanning lines corresponding to each block are sequentially arranged in an extending direction of the data line.

According to a third aspect of the present invention, in the second aspect of the present invention, the scanning driving unit sequentially shifts each block in a unit of scanning lines whose number is smaller than a maximum number of scanning lines corresponding to each block, in each period of a length not smaller than one frame period as a length approximately equal to a sum of the common selection period and the scanning period that are provided in each block.

According to a fourth aspect of the present invention, in the third aspect of the present invention, the scanning driving unit sequentially shifts, in the each one frame period, each block in a unit of scanning lines whose number is obtained by dividing a maximum number of scanning lines corresponding to each block by N, using N frame periods (N is an integer not smaller than two and smaller than a maximum number of scanning lines corresponding to each block) as one cycle.

According to a fifth aspect of the present invention, in the first aspect of the present invention, each of the detecting unit and the correction output unit is provided for each of the data lines.

According to a sixth aspect of the present invention, in the first aspect of the present invention, each of the detecting unit and the correction output unit is provided for each predetermined number of two or more data lines.

According to a seventh aspect of the present invention, in the sixth aspect of the present invention, the display device further includes: a selector for connecting each of the detecting unit and the correction output unit to the predetermined number of data lines.

According to an eighth aspect of the present invention, in one of the first to seventh aspects of the present invention, the driving transistor is a thin-film transistor having a channel layer formed of an oxide semiconductor.

According to a ninth aspect of the present invention, in the eighth aspect of the present invention, the oxide semiconductor contains indium, gallium, zinc, and oxygen as main components.

According to a tenth aspect of the present invention, in one of the first to seventh aspects of the present invention, an annealing process using laser light is performed to the driving transistor at a time of forming the driving transistor, and the extending direction of the data line is along a direction of each scanning of the laser light in the annealing process.

According to an eleventh aspect of the present invention, in one of the first to seventh aspects of the present invention, the pixel circuit further includes: an input transistor that has a control terminal connected to the scanning line, and that becomes in an on state when the scanning line is being selected; and a driving capacitor element that holds a voltage corresponding to a voltage supplied via the data line, and the driving transistor controls the driving current corresponding to a voltage held by the driving capacitor element.

According to a twelfth aspect of the present invention, in the eleventh aspect of the present invention, the detecting unit includes a correction capacitor element charged to a correction voltage corresponding to a characteristic of the driving transistor in the common selection period, and the correction output unit supplies to the data line a voltage that is obtained by adding to the data voltage or by subtracting from the data voltage the correction voltage held by the correction capacitor element in the scanning period.

According to a thirteenth aspect of the present invention, in the twelfth aspect of the present invention, a pixel circuit corresponding to a scanning line selected in the common selection period supplies a voltage corresponding to a threshold voltage of the driving transistor, from the input transistor in an on state to the detecting unit via the data line, and the detecting unit gives, to one end of the correction capacitor element, a voltage supplied from the pixel circuit corresponding to the scanning line selected in the common selection period, and gives a first fixed voltage to the other end of the correction capacitor element.

According to a fourteenth aspect of the present invention, in the thirteenth aspect of the present invention, the detecting unit further includes a detection switch unit that connects the one end of the correction capacitor element to the data line and that gives the first fixed voltage to the other end of the correction capacitor element, in a detection period within the common selection period, and the correction output unit includes: a buffer amplifier having an input terminal connected to the one end of the correction capacitor element; and a correction output switch unit that gives the data voltage to the other end of the correction capacitor element of the detecting unit, and that connects an output terminal of the buffer amplifier to the data line, in the scanning period.

According to a fifteenth aspect of the present invention, in the fourteenth aspect of the present invention, the data driving unit further includes a fixed voltage supply unit that is provided in each of the data lines, and that supplies a second fixed voltage to the data line in the common selection period and before the detection period.

According to a sixteenth aspect of the present invention, in the twelfth aspect of the present invention, a pixel circuit corresponding to a scanning line selected in the common selection period supplies a driving current that flows to the driving transistor, from the input transistor in an on state to the detecting unit via the data line, and the detecting unit gives, to one end of the correction capacitor element, a voltage corresponding to a threshold voltage of the driving transistor obtained based on the driving current supplied from the pixel circuit corresponding to the scanning line selected in the common selection period, and gives a first fixed voltage to the other end of the correction capacitor element.

According to a seventeenth aspect of the present invention, in the sixteenth aspect of the present invention, the detecting unit and the correction output unit include in common: an operational amplifier having a inverting input terminal connected to the data line; and a control switch that is provided between the inverting input terminal and an output terminal of the operational amplifier, and that is opened in the common selection period and is closed in the scanning period, the detecting unit further includes: a load unit that is provided in parallel with the control switch between the inverting input terminal and the output terminal of the operational amplifier; and a detection switch unit that connects the one end of the correction capacitor element to the output terminal of the operational amplifier, that gives the first fixed voltage to the other end of the correction capacitor element, and that gives a second fixed voltage to the non-inverting input terminal of the operational amplifier, in the common selection period, and the correction output unit further includes a correction output switch unit that gives the data voltage to the one end of the correction capacitor element, and that connects the other end of the correction capacitor element to the non-inverting input terminal of the operational amplifier, in the scanning period.

According to an eighteenth aspect of the present invention, in the seventeenth aspect of the present invention, the load unit is a diode element.

According to a nineteenth aspect of the present invention, in the eighteenth aspect of the present invention, when the number of scanning lines corresponding to one block is k, a current supply capacity of the diode element is approximately equal to k times of a current supply capacity of the driving transistor.

According to a twentieth aspect of the present invention, in the nineteenth aspect of the present invention, the driving transistor is a thin-film transistor, and the diode element is configured by a MOSFET with an aspect ratio smaller than that of the driving transistor.

According to a twenty-first aspect of the present invention, in the eleventh aspect of the present invention, the pixel circuit further includes a light emission control transistor that is provided in series with the electro-optic element, and that becomes in an off state at least when a scanning line corresponding to the pixel circuit is being selected.

According to a twenty-second aspect of the present invention, there is provided a driving method of an active matrix-type display device, the device including a display unit including a plurality of data lines, a plurality of scanning lines, and a plurality of pixel circuits disposed corresponding to the plurality of data lines and the plurality of scanning lines; a data driving unit connected to the plurality of data lines; and a scanning driving unit connected to the plurality of scanning lines, the pixel circuit including an electro-optic element driven by a current; and a driving transistor that is provided in series with the electro-optic element and that controls a driving current to be supplied to the electro-optic element, in accordance with a voltage supplied via the data line, the driving method including: a scanning driving step for driving the plurality of scanning lines, by making each scanning line correspond to any one of one or more blocks, and by providing, for each block, a common selection period for selecting a whole or a part of scanning lines corresponding to the block, and a scanning period for sequentially selecting scanning lines corresponding to the block; a detecting step for detecting a characteristic of the driving transistor via the data line from a pixel circuit corresponding to a scanning line which is being selected in the common selection period; and a correction output step for supplying to the data line a voltage obtained by correcting a data voltage indicating gradation data, based on a characteristic of the driving transistor detected through the detecting step in the common selection period immediately before the scanning period.

According to a twenty-third aspect of the present invention, in the twenty-second aspect of the present invention, in the scanning driving step, each scanning line corresponds to any one of a plurality of the blocks, and the scanning lines corresponding to each block are sequentially arranged in an extending direction of the data lines.

According to a twenty-fourth aspect of the present invention, in the twenty-third aspect of the present invention, in the scanning driving step, each block is sequentially shifted in a unit of scanning lines whose number is smaller than a maximum number of scanning lines corresponding to each block, in each period of a length not smaller than one frame period as a length approximately equal to a sum of the common selection period and the scanning period that are provided in each block.

According to a twenty-fifth aspect of the present invention, in the twenty-fourth aspect of the present invention, in the scanning driving step, each block is sequentially shifted, in a unit of scanning lines whose number is obtained by dividing a maximum number of scanning lines corresponding to each block by N, using N frame periods (N is an integer not smaller than two and smaller than a maximum number of scanning lines corresponding to each block) as one cycle.

According to a twenty-sixth aspect of the present invention, in the twenty-second aspect of the present invention, in the detecting step, a characteristic of the driving transistor is detected via the data line from a pixel circuit corresponding to a scanning line which is being selected in the common selection period, for each of the data lines.

According to a twenty-seventh aspect of the present invention, in the twenty-second aspect of the present invention, in the detecting step, a characteristic of the driving transistor is detected via the data line from a pixel circuit corresponding to a scanning line which is being selected in the common selection period, for each of a predetermined number of two or more data lines.

Effects of the Invention

According to the first aspect of the present invention, an average characteristic or a representative characteristic of driving transistors corresponding to each block is detected, and a characteristic variation of driving transistors is compensated for based on a result of the detection. By detecting a characteristic of the driving transistor on a block basis in this way, time required for the detection is shortened, as compared with the case of detecting a characteristic of the driving transistor on one scanning line basis. Therefore, a shortage of the writing time can be solved. Further, because detection of a characteristic of the driving transistor and correction based on the result of the detection are performed respectively by the detecting unit and the correction output unit in the data driving unit, a transistor for compensating for a characteristic variation of the driving transistor does not need to be added to the inside of the pixel circuit. Further, the detecting unit and the correction output unit do not require a memory for compensation. From the above, according to the first aspect of the present invention, a characteristic variation of the driving transistor can be compensated for while solving the shortage of the writing time, with a simple configuration.

According to the second aspect of the present invention, by setting the number of blocks to at least two, and by making scanning lines sequentially arranged in an extending direction of data lines correspond to one block, an effect similar to that of the first aspect of the present invention can be obtained. As compared with the case of setting the number of blocks to one, an average characteristic or a representative characteristic of driving transistors corresponding to each block get closer to each characteristic of the driving transistors corresponding to each block. Therefore, for each block, compensation accuracy of a characteristic variation of driving transistors can be increased.

According to the third aspect of the present invention, because the block shifts in each predetermined period based on a unit of scanning lines whose number is smaller than a maximum number of scanning lines that correspond to each block, it is possible to prevent a brightness boundary due to a difference between blocks of an average characteristic or a representative characteristic of the driving transistors from being visually recognized.

According to the fourth aspect of the present invention, an effect similar to that of the third aspect of the present invention can be obtained, by shifting the block by using N frame periods as one cycle.

According to the fifth aspect of the present invention, because an average characteristic or a representative characteristic of driving transistors corresponding to each block is detected for each data line, compensation accuracy of a characteristic variation of the driving transistor can be increased.

According to the sixth aspect of the present invention, because the detecting unit and the correction output unit are provided in common to a predetermined number of two or more data lines, a circuit scale of the data driving unit can be reduced. Although an average characteristic or a representative characteristic of driving transistors corresponding to each block is detected for each predetermined number of two or more data lines, sufficient compensation accuracy can be maintained when characteristics between adjacent driving transistors are approximately uniform.

According to the seventh aspect of the present invention, an effect similar to that of the sixth aspect of the present invention can be obtained reliably, by using a selector.

According to the eighth aspect of the present invention, because an oxide TFT (a TFT having a channel layer formed of an oxide transistor) having relatively high mobility is used as a driving transistor, high brightness can be obtained. Further, among oxide TFTs, in the case of using particularly an IGZO-TFT having a channel layer formed of InGaZnOx (hereinafter, referred to as the "IGZO") as an oxide semiconductor containing indium (In), gallium (Ga), zinc (Zn), and oxygen (O) as main components, characteristics are approximately uniform between adjacent IGZO-TFTs (see Non-Patent Document 1). Therefore, characteristics become uniform between driving transistors corresponding to each block. Consequently, compensation accuracy of a characteristic variation of the driving transistor can be increased, for each block. Further, in the case where the detecting unit and the correction output unit are provided in common for a predetermined number of two or more data lines, sufficient compensation accuracy can be also maintained.

According to the ninth aspect of the present invention, an effect similar to that of the eighth aspect of the present invention can be obtained by using an IGZO-TFT.

According to the tenth aspect of the present invention, a transistor to which an annealing process using laser light is performed at a time of forming is used as the driving transistor, and scanning lines sequentially arranged in a direction of each scanning of the laser light in the annealing process correspond to one block. A driving transistor to which the annealing process is performed is a low-temperature polysilicon TFT or the like, for example. Because a characteristic variation of driving transistors is made approximately uniform in the direction of each scanning of the laser light, an average characteristic or a representative characteristic of the driving transistors that correspond to each block and are arranged in the extending direction of the data lines gets closer to characteristics of the driving transistors arranged in the extending direction of the data lines. Therefore, compensation accuracy of a characteristic variation of driving transistors can be increased, for each block.

According to the eleventh aspect of the present invention, in the mode that the pixel circuit includes an input transistor and a driving capacitor element, an effect similar to the effect of any one of the first aspect to the seventh aspect of the present invention can be obtained.

According to the twelfth aspect of the present invention, a data voltage is offset-corrected by a correction voltage held in the correction capacitor element in the scanning period. Therefore, threshold voltage compensation of the driving transistor can be performed.

According to the thirteenth aspect of the present invention, threshold voltage compensation of the driving transistor can be performed, by setting a difference between a voltage corresponding to a threshold voltage of the driving transistor and the first fixed voltage, as the correction voltage.

According to the fourteenth aspect of the present invention, an effect similar to that of the thirteenth aspect of the present invention can be obtained more reliably, by using a detection switch unit, a buffer amplifier, and a correction output switch unit.

According to the fifteenth aspect of the present invention, by providing the driving capacitor element with a proper second fixed voltage within a common selection period and also before a detection period, it is possible to shorten time that a voltage corresponding to a threshold voltage of the driving transistor requires to be supplied from the pixel circuit to the detecting unit.

According to the sixteenth aspect of the present invention, it is possible to perform threshold voltage compensation of the driving transistor, by setting a difference between the voltage corresponding to a threshold voltage of the driving transistor obtained based on a driving current and the first fixed voltage, as the correction voltage.

According to the seventeenth aspect of the present invention, in a common selection period, the operational amplifier and the load unit function as a transimpedance circuit when the control switch opens. Therefore, the correction capacitor element is charged to the correction voltage by the operation of the detection switch unit. In a scanning period, because the operational amplifier functions as a buffer amplifier when the control switch closes, a voltage obtained by offset-correcting the data voltage by using the correction voltage by the operation of the correction output switch unit is supplied to the data line. Therefore, an effect similar to that of the sixteenth aspect of the present invention can be obtained more reliably. Further, by using the transimpedance circuit, the correction capacitor element can be charged to the correction voltage at a high speed.

According to the eighteenth aspect of the present invention, by logarithmically converting the driving current, a voltage corresponding to a threshold voltage of the driving transistor can be obtained.

According to the nineteenth aspect of the present invention, a voltage corresponding to a threshold voltage of the driving transistor can be obtained directly from the driving current.

According to the twentieth aspect of the present invention, by adjusting an aspect ratio of a MOSFET (Metal-Oxide-Semiconductor Field-Effect Transistor) that configures a diode element, a current supply capacity of the diode element can be set to approximately equal to k times (where k represents the number of scanning lines corresponding to one block) of the current supply capacity of the driving transistor.

According to a twenty-first aspect of the present invention, by the light-emitting control transistor, the supply of a driving current to the electro-optic element stops when a scanning line corresponding to the pixel circuit is being selected. Therefore, abnormal light emission of the electro-optic element can be suppressed, for example.

According to the twenty-second aspect to the twenty-seventh aspect of the present invention, in the driving method of the display device, effects similar to those of the first aspect to the sixth aspect of the present invention can be obtained.

MODES FOR CARRYING OUT THE INVENTION

First to fifth embodiments of the present invention will be described below with reference to the accompanying drawings. In the following, m and n are integers not smaller than 2, i is an integer between 1 and n inclusive, and j is an integer between 1 and m inclusive. A transistor included in a pixel circuit in each embodiment is a field-effect transistor, and is typically a thin-film transistor (TFT). Examples of the transistor included in the pixel circuit include an oxide TFT that is represented by an IGZO-TFT, a low temperature polysilicon TFT, and an amorphous silicon TFT. The oxide TFT such as an IGZO-TFT is particularly effective in the case of using the oxide TFT as an n-channel type transistor included in the pixel circuit. However, the present invention does not exclude the use of a p-channel type oxide TFT.

1. First Embodiment 1.1 Overall Configuration

Figure 1:
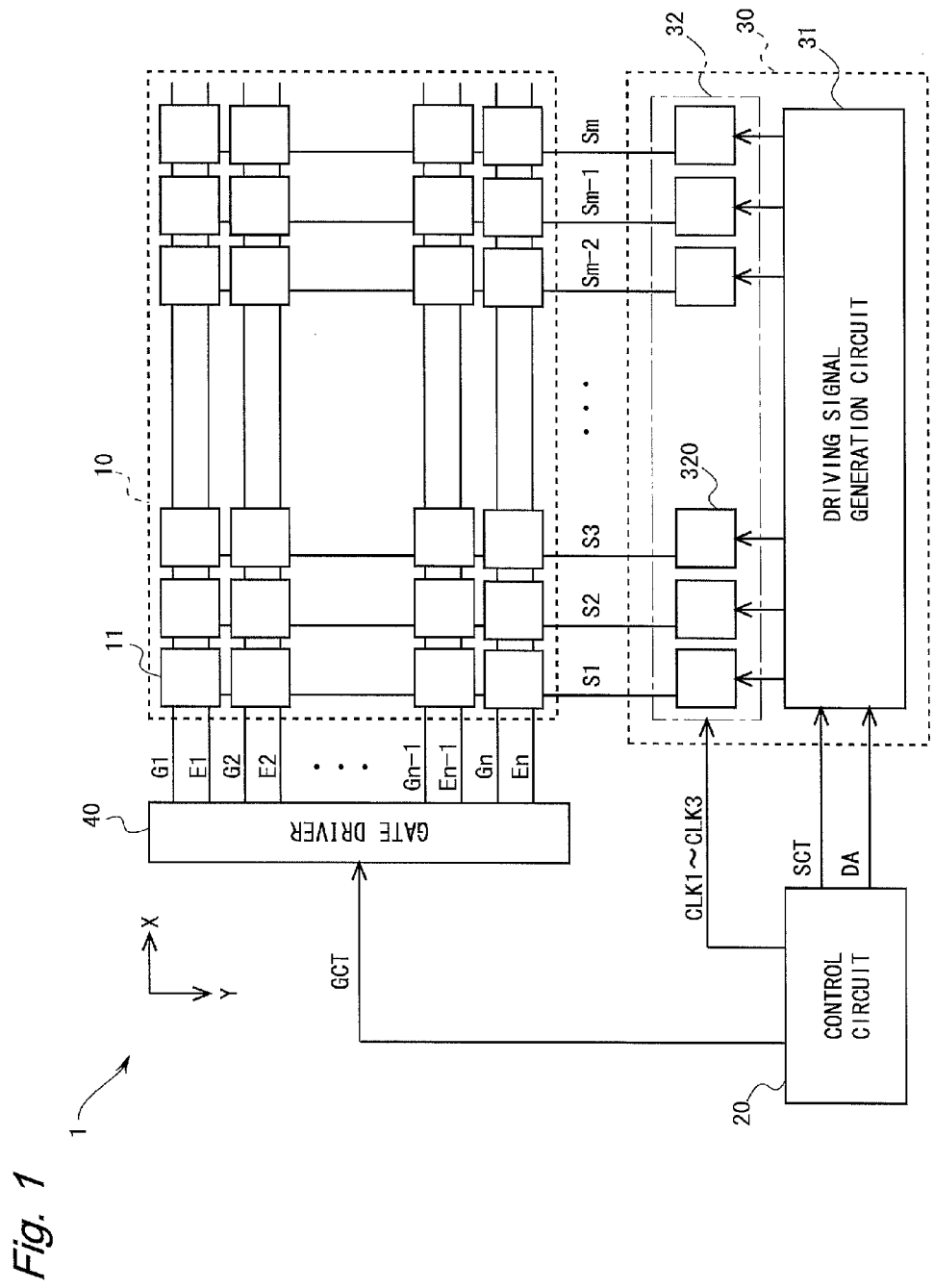
FIG. 1 is a block diagram showing a configuration of an organic EL display device according to a first embodiment of the present invention.

FIG. 1 is a block diagram showing a configuration of an active matrix-type organic EL display device 1 according to a first embodiment of the present invention. The organic EL display device 1 includes a display unit 10, a control circuit 20, a source driver 30, and a gate driver 40. In the present embodiment, the source driver 30 corresponds to a data driving unit, and the gate driver 40 corresponds to a scanning driving unit. One or both of the source driver 30 and the gate driver 40 may be formed integrally with the display unit 10.

The display unit 10 is provided with m data lines S1 to Sm, and n scanning lines G1 to Gn intersecting with the m data lines S1 to Sm perpendicularly. In the following, an extending direction of the data lines is defined as a Y direction, and an extending direction of the scanning lines is defined as an X direction. Further, components along the Y direction will be occasionally called a "column", and components along the X direction will be occasionally called a "row". The display unit 10 is also provided with n emission lines E1 to En along the n scanning lines G1 to Gn. Also in the display unit 10, (m×n) pixel circuits 11 are arranged at the respective intersections of the m data lines S1 to Sm and the n scanning lines G1 to Gn. Each pixel circuit 11 forms one of a red sub-pixel (hereinafter, referred to as the "R sub-pixel"), a green sub-pixel (hereinafter, referred to as the "G sub-pixel"), and a blue sub-pixel (hereinafter, referred to as the "B sub-pixel"). The pixel circuits 11 arranged in the X direction form the R sub-pixel, the G sub-pixel, and the B sub-pixel in turn from a gate driver 40 side, for example. Colors of the sub-pixels are not limited to red, green, and blue, and may be cyan, magenta, and yellow. The display unit 10 is also provided with a power supply line that supplies a high-level power supply voltage Vp (hereinafter, referred to as the "high-level power supply line", which is denoted by the same symbol Vp as that of the high-level power supply voltage) not shown, and a power supply line that supplies a low-level power supply voltage Vcom (hereinafter, referred to as the "low-level power supply line", which is denoted by the same symbol Vcom as that of the low-level power supply voltage) not shown. Each of the high-level power supply voltage Vp and the low-level power supply voltage Vcom is a fixed voltage, and the low-level power supply voltage Vcom is a ground voltage, for example.

The control circuit 20 controls the source driver 30 and the gate driver 40, by transmitting video data DA, a source control signal SCT, and first to third clocks CLK1 to CLK3 to the source driver 30, and by transmitting a gate control signal GCT to the gate driver 40. The source control signal SCT includes a source start pulse, a source clock, and a latch strobe signal, for example. The gate control signal GCT includes a gate start pulse, and a gate clock, for example.

The source driver 30 is connected to the m data lines S1 to Sm, and includes a driving signal generation circuit 31, and a detection/correction output unit 32. The driving signal generation circuit 31 includes a shift register, a sampling circuit, a latch circuit, and m D/A converters that are not shown. The detection/correction output unit 32 includes m detection/correction output circuits 320. The m detection/correction output circuits 320 correspond respectively to the m data lines S1 to Sm. The m detection/correction output circuits 320 also correspond respectively to the m D/A converters.

The shift register in the driving signal generation circuit 31 sequentially outputs a sampling pulse by sequentially transferring the source start pulse in synchronization with the source clock. The sampling circuit sequentially stores video data DA for one row, in accordance with the timing of the sampling pulse. The latch circuit latches and holds the video data DA for one row, which is stored in the sampling circuit, in accordance with the latch strobe signal, and also gives the video data DA for one column (that is, for one sub-pixel) (hereinafter, referred to as the "gradation data") to a corresponding D/A converter. The D/A converter converts the received gradation data into a data voltage, and gives the data voltage that indicates the gradation data, to a corresponding detection/correction output circuit 320. In this way, the driving signal generation circuit 31 gives data voltages for the m columns as driving signals, to the m detection/correction output circuits 320 based on the video data DA and the source control signal SCT.

The detection/correction output circuit 320 detects a characteristic of the driving transistor in the pixel circuit 11 via the corresponding data line, in accordance with the timing of the first to third clocks CLK1 to CLK3, and corrects the data voltage received from the corresponding D/A converter and obtains the corrected data voltage, based on the detected characteristic of the driving transistor. The detection/correction output circuit 320 supplies the corrected data voltage to the corresponding data line. A configuration and a detailed operation of the detection/correction output circuit 320 will be described later.

The gate driver 40 is connected to the n scanning lines G1 to Gn and the n emission lines E1 to En, and drives these scanning lines and emission lines. More specifically, the gate driver 40 includes a shift register, a logic circuit, and the like that are not shown. The shift register that sequentially transfers the gate start pulse in synchronization with the gate clock, and the logic circuit, to which an output is given from any stage of the shift register, generate signals to be supplied to the n scanning lines G1 to Gn and signals to be supplied to the n emission lines E1 to En. It may be arranged such that the gate driver 40 drives only the n scanning lines G1 to Gn, and by separately providing an emission driver, the emission driver drives the n emission lines E1 to En.

1.2 Dividing into Blocks

Figure 2:
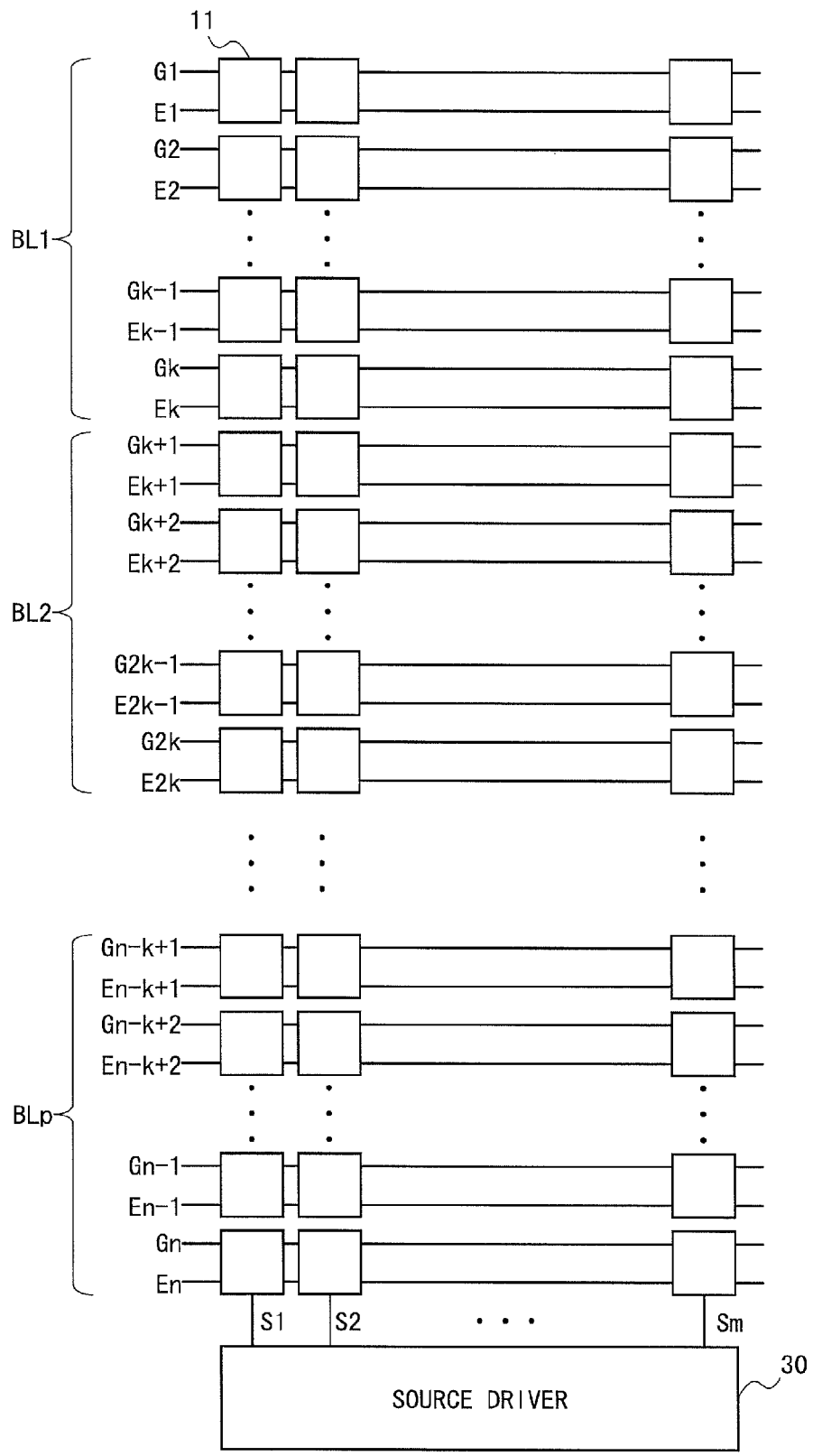
FIG. 2 is a block diagram for describing a dividing into blocks according to the first embodiment.

The gate driver 40 according to the present embodiment divides the n scanning lines G1 to Gn into a plurality of blocks, and drives the scanning lines on a block basis. FIG. 2 is a block diagram for describing the dividing into blocks according to the present embodiment. As shown in FIG. 2, the gate driver 40 drives the scanning lines by dividing the n scanning lines G1 to Gn into first to p-th blocks BL1 to BLp. To each block, k scanning lines correspond. Here, p=n/k, 1<k<n, and k is an integer. Further, the gate driver 40 also drives the emission lines by dividing the n emission lines E1 to En into first to p-th blocks BL1 to BLp. In the present embodiment, the number of blocks is at least two. However, the present invention can be also applied to a case where the number of blocks is one by setting k=n.

The scanning lines G1 to Gk of the first to k-th rows and the emission lines E1 to Ek of the first to k-th rows correspond to the first block BL1. The scanning lines Gk+1 to G2k of the (k+1)-th to 2k-th rows and the emission lines Ek+1 to E2k of the (k+1)-th to 2k-th rows correspond to the second block BL2. The scanning lines Gn-k+1 to Gn of the (n-k+1)-th to n-th rows and the emission lines En-k+1 to En of the (n-k+1)-th to n-th rows correspond to the p-th block BLp. In this way, the k scanning lines that correspond to each block are sequentially arranged in the Y direction. Hereinafter, the expression of "included in the block" is also used to express the same meaning as "corresponding to the block". Further, the pixel circuits 11 corresponding to the scanning lines included in the block is also expressed as "the pixel circuits 11 included in the block". In the present embodiment, the numbers of the scanning lines included in the p blocks BL1 to BLp are set to the same number (k). However, the present invention is not limited to this, and the numbers of the scanning lines included in the p blocks BL1 to BLp may be different from each other.

The gate driver 40 provides, for each block, a common selection period for selecting a whole or a part of k scanning lines included in the block, and a scanning period for sequentially selecting k scanning lines included in the block. Hereinafter, the common selection period and the scanning period will be collectively called a "block selection period". Hereinafter, a block that includes a scanning line which is being selected in the block selection period will be called a "selection block". The gate driver 40 sequentially shifts the selection block.

1.3 Pixel Circuit and Detection/Correction Output Circuit

Figure 3:
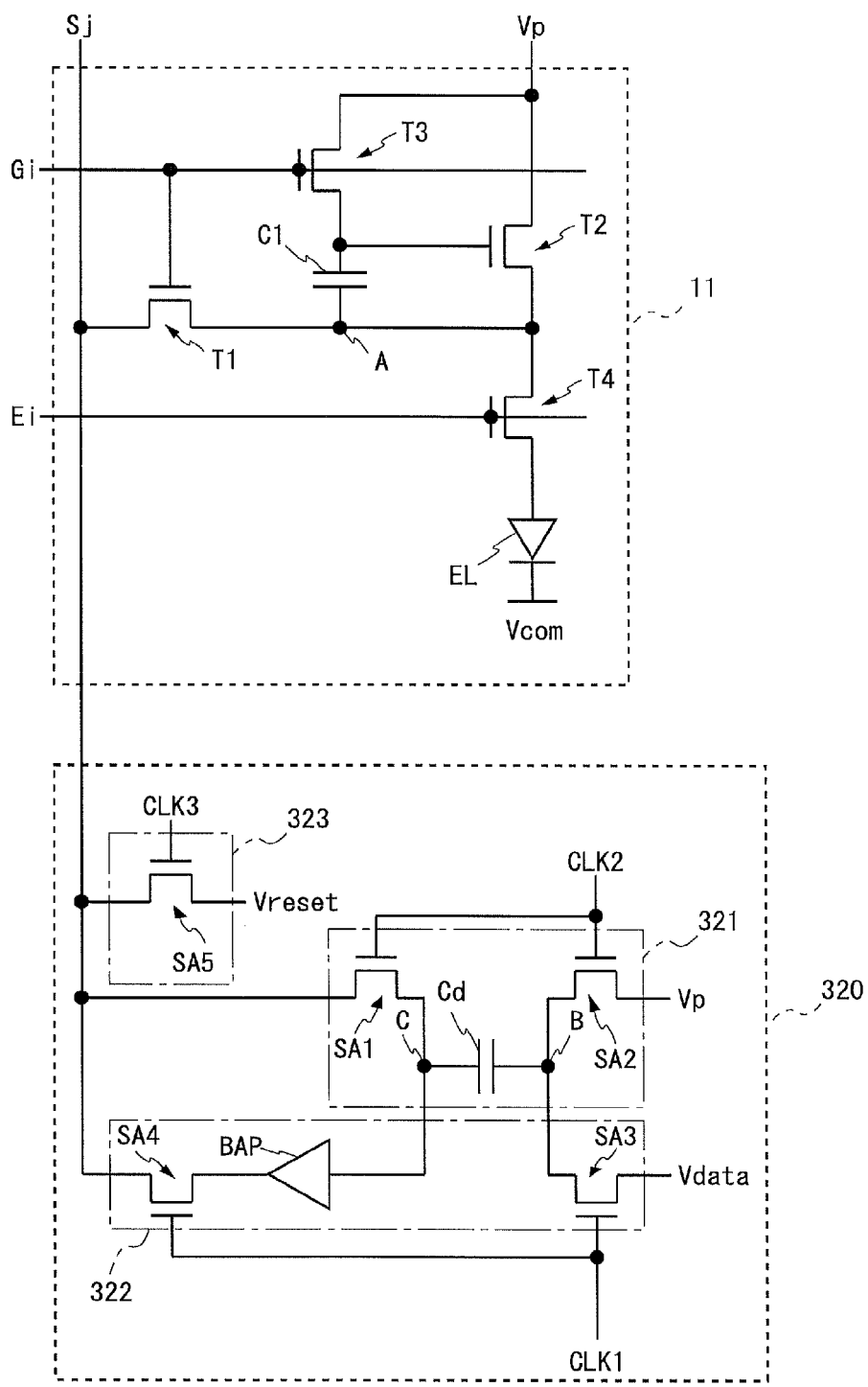
FIG. 3 is a circuit diagram showing configurations of a pixel circuit and a detection/correction output circuit according to the first embodiment.

FIG. 3 is a circuit diagram showing configurations of the pixel circuit 11 and the detection/correction output circuit 320 according to the present embodiment. Here, the pixel circuit 11 shown in FIG. 3 is the pixel circuit 11 in the i-th row and the j-th column. The detection/correction output circuit 320 shown in FIG. 3 corresponds to the data line Sj of the j-th column.

The pixel circuit 11 includes one organic EL element EL, four transistors T1 to T4, and one capacitor C1. The transistor T1 is an input transistor, the transistor T2 is a driving transistor, the transistor T3 is a power supply voltage supply transistor, and the transistor T4 is a light emission control transistor. The capacitor C1 corresponds to a driving capacitor element. The transistors T1 to T4 are all n-channel type IGZO-TFTs. However, it is sufficient that at least the transistor T2 is an IGZO-TFT.

The transistor T2 is connected in series with the organic EL element EL, and has, as a first conductive terminal, a drain terminal connected to the high-level power supply line Vp. The transistor T1 has a gate terminal (corresponding to a control terminal, and this also applies to gate terminals of the other transistors) connected to a scanning line Gi, and is provided between a source terminal as a second conductive terminal of the transistor T2 and the data line Sj. The transistor T3 has a gate terminal connected to the scanning line Gi, and is provided between a gate terminal and the drain terminal of the transistor T2. The transistor T4 has a gate terminal connected to the emission line Ei, and is provided between the source terminal of the transistor T2 and an anode terminal of the organic EL element EL. The capacitor C1 has one end connected to the source terminal of the transistor T2 and has the other end connected to the gate terminal of the transistor T2. The cathode terminal of the organic EL element EL is connected to the low-level power supply line Vcom. Hereinafter, in the description concerning the present embodiment, a connection point between the source terminal of the transistor T2, the one end of the capacitor C1, the conductive terminal of the transistor T1 positioned at the source terminal side of the transistor T2, and the conductive terminal of the transistor T4 positioned at the source terminal side of the transistor T2 will be called a "first node A", for the sake of convenience.

The detection/correction output circuit 320 includes a detecting unit 321, a correction output unit 322, and a reset unit 323. The reset unit 323 corresponds to a fixed voltage supply unit. The detecting unit 321 includes one capacitor Cd, and two transistors SA1 and SA2. In the present embodiment, the capacitor Cd corresponds to a correction capacitor element, and a detection switch unit is realized by the transistors SA1 and SA2. The correction output unit 322 includes one buffer amplifier BAP, and two transistors SA3 and SA4. In the present embodiment, a correction output switch unit is realized by the transistors SA3 and SA4. The reset unit 323 includes one transistor SA5. Although the conductivity type of the transistors SA1 to SA5 is the n-channel type in FIG. 3, the conductivity type may be the p-channel type. In place of the transistors SA1 to SA5, other components or circuits that have a switching function may be used.

The transistor SA1 has a gate terminal to which the second clock CLK2 is supplied, and is provided between one end of the capacitor Cd and the data line Sj. The transistor SA2 has a gate terminal to which the second clock CLK2 is supplied, a first conductive terminal connected to the other end of the capacitor Cd, and a second conductive terminal to which the high-level power supply voltage Vp is supplied as a first fixed voltage. The transistor SA3 has a gate terminal to which the first clock CLK1 is supplied, a first conductive terminal connected to the other end of the capacitor Cd, and a second conductive terminal to which a data voltage Vdata is supplied. The transistor SA4 has a gate terminal to which the first clock CLK1 is supplied, and is provided between the data line Sj and the output terminal of the buffer amplifier BAP. The transistor SA5 has a gate terminal to which the third clock CLK3 is supplied, a first conductive terminal connected to the data line Sj, and a second conductive terminal to which a reset voltage Vreset is supplied as a second fixed voltage. The reset voltage Vreset is given from the control circuit 20 or other circuits not shown. The input terminal of the buffer amplifier BAP is connected to the one end of the capacitor Cd.

Hereinafter, in the description concerning the present embodiment, a connection point between the other end of the capacitor Cd, the first conductive terminal of the transistor SA2, and the first conductive terminal of the transistor SA3 will be called a "second node B", for the sake of convenience. Further, a connection point between the one end of the capacitor Cd, the conductive terminal of the transistor SA1 positioned at the one end side of the capacitor Cd, and the input terminal of the buffer amplifier BAP will be called a "third node C", for the sake of convenience.

1.4 Operation

Figure 4:
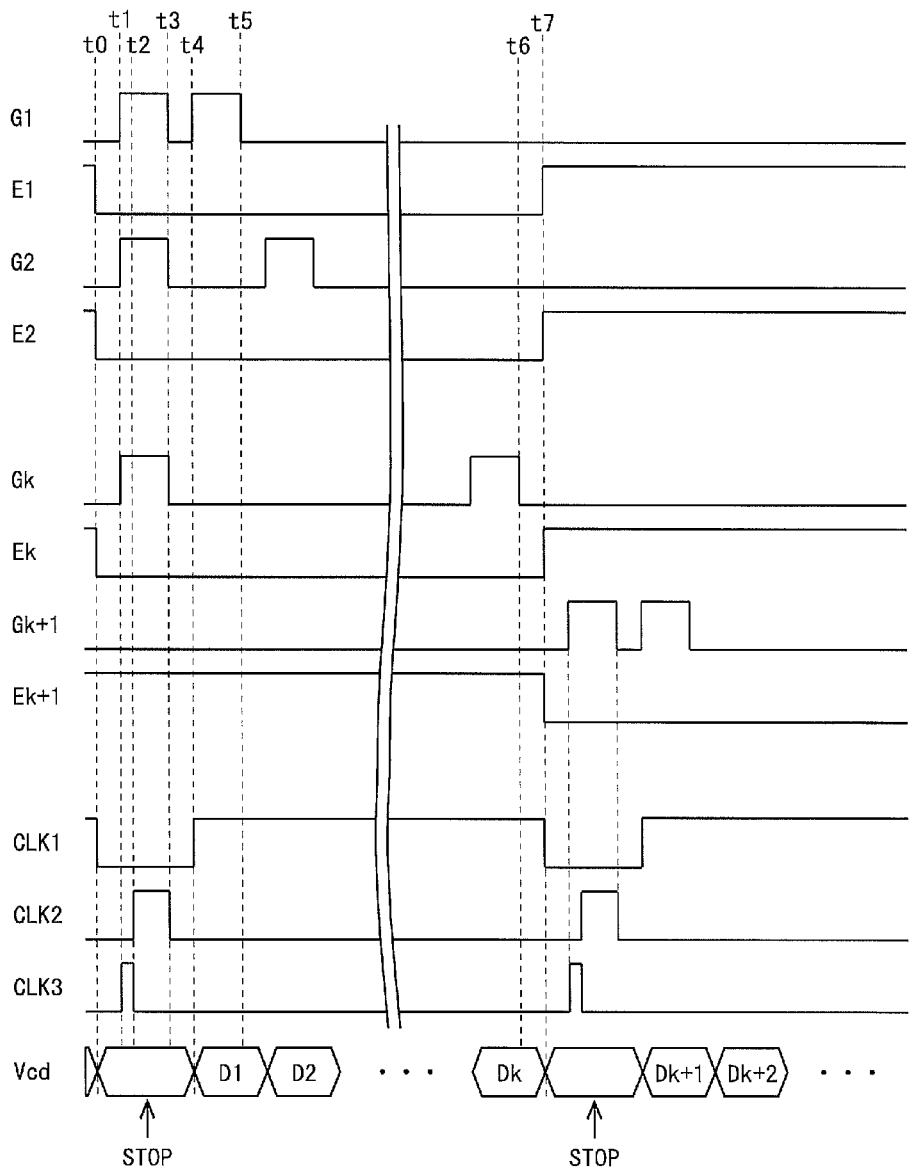
FIG. 4 is a timing chart for describing operation of the pixel circuit and the detection/correction output circuit according to the first embodiment.

FIG. 4 is a timing chart for describing operation of the pixel circuit 11 and the detection/correction output circuit 320 according to the present embodiment. In FIG. 4, a period from time t1 to time t6 is a block selection period of the first block BL1, a period from time t1 to time t3 is a common selection period, a period from time t4 to time t6 is a scanning period, a period from time t1 to time t2 is a reset period, and a period from time t2 to time t3 is a detection period. In the present embodiment, because each of the transistors T1 and T3 having the gate terminals connected to scanning lines is of n-channel type, each scanning line becomes in a selection state when the potential is at a high level. In FIG. 4, a symbol Vcd denotes a corrected data voltage. In FIG. 4, a symbol Di (i=1 to n) denotes that the corrected data voltage Vcd is based on gradation data corresponding to the i-th row. Hereinafter, in the description of the operation described with reference to FIG. 4 is focused on the j-th column, for the sake of convenience. However, it should be noted that the operation similar to that in the j-th column is performed in each of the first column to the m-th column.

In the present embodiment, a period of the sum of the block selection periods in the first to p-th blocks BL1 to BLp plus the sum of the period from time t0 to time t1 and the period from time t6 to time t7 before and after each block selection period corresponds to one frame period. However, time t0 and time t1 may be coincided with each other, and time t6 and time t7 may be coincided with each other. In this case, the sum of the block selection periods in the first to p-th blocks BL1 to BLp corresponds to one frame period.

Before time t0, the potentials of the scanning lines G1 to Gk of the first to k-th rows are at the low levels, and the potentials of the emission lines E1 to Ek of the first to k-th rows are at the high levels. The first clock CLK1 is at the high level, and the second and third clocks CLK2 and CLK3 are at the low levels. At this time, in the pixel circuits 11 of the first to k-th rows, the transistors T1 and T3 are in the off state and the transistor T4 is in the on state. Therefore, the transistor T2 is supplying a driving current Ioled corresponding to the gate-source voltage VgsT2 held in the capacitor C1, to the organic EL element EL. Consequently, the organic EL element EL is emitting light in the brightness in accordance with the driving current Ioled. At this time, the transistors SA3 and SA4 are in the on state, and the transistors SA1, SA2, and SA5 are in the off state. Therefore, the corrected data voltage Vcd corresponding to each row is sequentially supplied from the buffer amplifier BAP to the data line Sj. The corrected data voltage Vcd will be described later.

At time t0, the potentials of the emission lines E1 to Ek of the first to k-th rows change to the low levels. Therefore, in the pixel circuits 11 of the first to k-th rows, the transistor T4 is turned off. Consequently, because the anode terminal of the organic EL element EL and the source terminal of the transistor T2 are electrically disconnected from each other, the supply of the driving current Ioled to the organic EL element EL stops. Accordingly, the light emission of the organic EL element EL stops. At this time, because the first clock CLK1 changes to the low level, the transistors SA3 and SA4 are turned off. Consequently, the supply of the corrected data voltage Vcd to the data line Sj stops. The potentials of the emission lines E1 to Ek of the first to k-th rows are maintained at the low levels until time t7.

At time t1, because the potentials of the scanning lines G1 to Gk of the first to k-th rows change to the high levels, the transistors T1 and T3 are turned on in the pixel circuits 11 of the first to k-th rows. Further, because the third clock CLK3 changes to the high level, the transistor SA5 is turned on. Therefore, the data line Sj is charged to the reset voltage Vreset so that the potential of the first node A becomes Vreset and the gate potential of the transistor T2 becomes Vp. Consequently, the capacitor C1 is charged to the gate-source voltage VgsT2 given by the following equation (1).

$$VgsT2 = Vp - Vreset \quad (1)$$

At time t2, the third clock CLK3 changes to the low level, and the second clock CLK2 changes to the high level. Therefore, the transistor SA5 is turned off, and the transistors SA1 and SA2 are turned on. At this time, in the pixel circuits 11 of the first to k-th rows, the driving current Ioled flows sequentially through the transistor T2, the first node A, the transistor T1, and the data line Sj. While the transistor T2 is in the on state, the potential of the first node A increases. Therefore, when there is sufficient time, the potential of the first node A increases until the gate-source voltage VgsT2 becomes equal to a threshold voltage VthT2 of the transistor T2. Because the potential of the data line Sj and the potential of the third node C are equal to the potential of the first node A, the potential of the third node C approaches (Vp−VthT2). When sufficient time is available as described above, the potential of the third node C becomes (Vp−VthT2). That is, (Vp−VthT2) is given to the capacitor Cd at one end, as a voltage that corresponds to the threshold voltage VthT2 of the transistor T2. Note that by setting the reset voltage Vreset to a proper level at which the transistor T2 is set to the on state, it is possible to shorten time required for the gate-source voltage VgsT2 to become equal to the threshold voltage VthT2 of the transistor T2, that is, time required for the voltage corresponding to the threshold voltage VthT2 of the transistor T2 to be supplied from the pixel circuit 11 to the detecting unit 321 in the detection period. Because the high-level power supply voltage Vp is given to the second node B via the transistor SA2, the potential of the second node B becomes Vp. In other words, the high-level power supply voltage Vp is given to the other end of the capacitor Cd. In this way, in the detection period, the capacitor Cd is charged to the correction voltage Vd given by the following equation (2).

$$Vd = Vp - VthT2 - Vp \qquad (2)$$
$$= -VthT2$$

Note that the correction voltage Vd shown by the equation (2) is obtained taking the second node B as the base.

The correction voltage Vd represents a characteristic of the transistor T2. More specifically, the correction voltage Vd represents the threshold voltage VthT2 of the transistor T2. That is, charging the capacitor Cd to the correction voltage Vd in the detection period means detecting a characteristic of the transistor T2, and more specifically, means detecting the threshold voltage VthT2 of the transistor T2. Hereinafter, charging the capacitor Cd to the correction voltage Vd will be occasionally expressed as "detecting the correction voltage Vd".

The VthT2 reflected in the potential of the third node C is actually an average value of the threshold voltages VthT2 of the transistors T2 that are respectively included in the k pixel circuits 11 included in the first block BL1 and arranged in the Y direction (the pixel circuits 11 of the first to k-th rows). Concerning the present invention, Non-Patent Document 1 discloses that characteristics are approximately uniform between adjacent IGZO-TFTs. Therefore, in the k pixel circuits 11 included in the same block and arranged in the Y direction, the threshold voltages VthT2 of the transistors T2 become approximately equal. Consequently, in the description using the numerical expressions in the present embodiment, it is assumed that the threshold voltages VthT2 of the transistors T2 are equal to each other in the k pixel circuits 11 included in the same block and arranged in the Y direction. For TFTs other than an IGZO-TFT (for example, an amorphous silicon TFT), it has been known that characteristics are approximately uniform in adjacent TFTs. Therefore, also in the case where the transistor T2 is a TFT other than an IGZO-TFT, it is possible to make an assumption similar to the case where the transistor T2 is an IGZO-TFT.

At time t3, because the potentials of the scanning lines G1 to Gk of the first to k-th rows change to the low levels, the transistors T1 and T3 are turned off in the pixel circuits 11 of the first to k-th rows. At this time, the threshold voltage VthT2 of the transistor T2 is being held in the capacitor C1. Because the second clock CLK2 changes to the low level, the transistors SA1 and SA2 are turned off. At this time, the correction voltage Vd is being held in the capacitor Cd.

At time t4, because the first clock CLK1 changes to the high level, the transistors SA3 and SA4 are turned on. At this time, because the data voltage Vdata is given to the second node B via the transistor SA3, the corrected data voltage Vcd given by the following equation (3) is supplied to the data line Sj via the buffer amplifier BAP and the transistor SA4.

$$Vcd = Vdata + Vd \qquad (3)$$
$$= Vdata - VthT2$$

In this way, the corrected data voltage Vcd is obtained by adding the correction voltage Vd held in the capacitor Cd to the data voltage Vdata. In other words, by offset-correcting the data voltage Vdata by the correction voltage Vd, the corrected data voltage Vcd is obtained. When the third node C is taken as the base of the correction voltage Vd, the corrected data voltage Vcd is obtained by subtracting the correction voltage Vd held in the capacitor Cd from the data voltage Vdata. At time t4, because the potential of the scanning line G1 of the first row changes to the high level, the transistors T1 and T3 are turned on in the pixel circuit 11 of the first row. The corrected data voltage Vcd is written into the pixel circuit 11 of the first row, and the potential of the first node A becomes Vcd and the gate potential of the transistor T2 becomes Vp. Consequently, the capacitor C1 is charged to the gate-source voltage VgsT2 given by the following equation (4).

$$VgsT2 = Vp - Vcd \qquad (4)$$
$$= Vp - Vdata + VthT2$$

At this time, because the anode terminal of the organic EL element EL and the source terminal of the transistor T2 are electrically disconnected from each other, abnormal light emission of the organic EL element EL that may be generated at the writing time of the corrected data voltage Vcd can be suppressed.

At time t5, because the potential of the scanning line G1 of the first row changes to the low level, the transistors T1 and T3 are turned off in the pixel circuit 11 of the first row. Therefore, the gate-source voltage VgsT2 held in the capacitor C1 is fixed at the value indicated by the equation (4). Thereafter, the scanning lines G2 to Gk of the second to k-th rows are sequentially selected (the potentials become at the high levels) in the scanning period up to time t6, so that the corrected data voltage Vcd is written into the pixel circuit 11 of each row.

At time t7, because the potentials of the emission lines E1 to Ek of the first to k-th rows change to the high levels, the transistors T4 of the pixel circuits 11 of the first to k-th rows are turned on. Therefore, the anode terminal of the organic EL element EL and the source terminal of the transistor T2 are electrically connected to each other. Consequently, the transistor T2 supplies the driving current Ioled given by the following equation (5), to the organic EL element EL.

$$Ioled = (\beta/2)*(VgsT2 - VthT2)^2 \quad (5)$$
$$= (\beta/2)*(Vp - Vdata)^2$$

Here, β denotes a gain of the transistor T2, and is proportional to the mobility and the like of the transistor T2. As expressed by the equation (5), by setting the gate-source voltage VgsT2 to a value expressed by the equation (4), the driving current Ioled becomes a value independent from the threshold voltage VthT2 of the transistor T2. In this way, because the variation in the threshold voltage is compensated for, a brightness variation can be suppressed.

At time t7, further, the potentials of the emission lines Ek+1 to E2$k$ of the (k+1) to 2k-th rows that are included in the second block BL2 change to the low levels, and thereafter, operation similar to that in the first block BL1 is performed for the second block BL2. In the third block BL3 and thereafter, operation similar to that in the first block BL1 is also performed. In this way, the selection block is sequentially shifted, and detection of the threshold voltages VthT2 and writing of the corrected data voltages Vcd in the pixel circuits 11 of all rows come to an end. By repeating the above operation, image display without a brightness variation is performed.

It has been assumed above that at time t1, the potentials of the scanning lines G1 to Gk of the first to k-th rows change to the high levels and the third clock CLK3 changes to the high level at the same time. However, it may be arranged such that after the potentials of the scanning lines G1 to Gk of the first to k-th rows change to the high levels, the third clock CLK3 changes to the high level. It has been assumed above that at time t2, the third clock CLK3 changes to the low level and the second clock CLK2 changes to the high level at the same time. However, it may be arranged such that after the third clock CLK3 changes to the low level, the second clock CLK2 changes to the high level. Further, time t3 and time t4 may be coincided with each other.

1.5 Writing Time

The writing time in the present embodiment will be considered here, assuming that n=1080, and p=60. In the present embodiment, time ta required to scan all scanning lines of 1080 rows is given by the following equation (6).

$$ta = tw*1080 + ts*60 \quad (6)$$

Here, tw denotes the writing time per row, and ts denotes the length of the common selection period. On the other hand, in the case of not detecting a characteristic of the driving transistor, time tb required to scan all scanning lines of 1080 rows is given by the following equation (7).

$$tb = tw*1080 \quad (7)$$

When tw=ts, from the equation (6) and the equation (7), it can be understood that, in the present embodiment, the writing time can be secured up to about 95% of the writing time in the case of not performing a characteristic detection of the driving transistor (hereinafter, referred to as the "ideal writing time"). Further, even when ts is changed to (2*ts) in the equation (6) to sufficiently compensate for a characteristic variation of the transistor T2, the writing time can be secured up to about 90% of the ideal writing time in the present embodiment.

Time tc required to scan all scanning lines of 1080 rows in the case of detecting a characteristic of the driving transistor on one scanning line basis is given by the following equation (8).

$$tc = tw*1080 + ts*1080 \quad (8)$$

When tw=ts, it can be understood that, in the case of detecting a characteristic of the driving transistor on one scanning line basis, the writing time can be secured by only 50% of the ideal writing time.

1.6 Effects

According to the present embodiment, the n scanning lines G1 to Gn are divided into the first block BL1 to the p-th block BLp, and the selection block is sequentially shifted. For the selection block, in the detection period within the common selection period, the capacitor Cd is charged to the correction voltage Vd corresponding to the threshold voltage VthT2 of the transistor T2. Thereafter, in the scanning period, the corrected data voltage Vcd obtained by offset-correcting the data voltage Vdata by the correction voltage Vd is supplied to the data line. Therefore, the average threshold voltage VthT2 of the k transistors T2 corresponding to each block is detected. Based on a result of the detection, threshold voltage compensation of the transistor T2 is performed. That is, a characteristic variation of the transistor T2 is compensated for. In this way, by detecting the threshold voltage VthT2 of the transistor T2 on a block basis, time required for the detection can be shortened as compared with the case of detecting the threshold voltage VthT2 of the transistor T2 on one scanning line basis. Therefore, a shortage of the writing time can be solved. Further, because detection of the threshold voltage VthT2 of the transistor T2 and correction based on the detection result are performed respectively by the detecting unit 321 and the correction output unit 322 in the source driver 30, it is not necessary to add to the pixel circuit 11 a transistor for performing threshold voltage compensation of the transistor T2. Further, because the correction voltage Vd is held in the capacitor Cd, the detecting unit 321 and the correction output unit 322 do not require a memory for compensation. From the above, it is possible to compensate for a characteristic variation of the transistor T2 while solving a shortage of the writing time, with a simple configuration.

Further, according to the present embodiment, because the n scanning lines G1 to Gn are divided into the first block BL1 to the p-th block BLp, as compared with the case where the number of blocks is set to one, the average threshold voltage VthT2 of the k transistors T2 corresponding to each block gets closer to respective threshold voltages VthT2 of the k transistors T2. Therefore, for each block, compensation accuracy of a characteristic variation of the transistors T2 can be increased. Further, because the transistor T2 is an IGZO-TFT, characteristics of the k transistors T2 corresponding to each block become approximately uniform. Accordingly, for each block, compensation accuracy of a characteristic variation of the transistors T2 can be increased further.

Further, according to the present embodiment, because the average threshold voltage VthT2 of the k transistors T2 corresponding to each block is detected for each data line, compensation accuracy of a characteristic variation of the transistors T2 can be increased.

Further, according to the present embodiment, by giving the reset voltage Vreset to the capacitor Cd within the common selection period and also before the detection period, time required for the voltage corresponding to the threshold voltage VthT2 of the transistor T2 to be supplied from the pixel circuit 11 to the detecting unit 321 in the detection period can be shortened.

Further, according to the present embodiment, the transistor T4 can suppress the abnormal light emission of the organic EL element EL that may be generated at the writing time of the corrected data voltage Vcd.

Further, according to the present embodiment, because an IGZO-TFT is used as the transistor T2, brightness can be increased as compared with the case of using an amorphous silicon TFT and the like. Further, because characteristics are approximately uniform between adjacent IGZO-TFTs, characteristics of the driving transistors that are included in each block become approximately uniform. Therefore, for each block, compensation accuracy of a characteristic variation of the driving transistors can be increased.

1.7 Modification

In the case where the average characteristics (the average threshold voltages VthT2) of the transistors T2 are different between the blocks, when the block is being fixed in each frame period like in the first embodiment, there is a possibility that a difference of characteristics of the blocks is visually recognized as a brightness boundary. Therefore, it is possible to employ a mode that the gate driver 40 shifts the block by using, as a unit, scanning lines not less than one and less than Ma in each predetermined frame period(s), for example. Here, Ma denotes a maximum number of scanning lines included in each block. When the number of the scanning lines included in each block is k, Ma=k. When there are a plurality of kinds of numbers of scanning lines included in each block, and when a maximum number of the scanning lines is k, Ma=k. In the following description concerning a modification of the first embodiment, it is assumed that Ma=k. The gate driver 40 in the modification of the first embodiment, more specifically, uses two frame periods as one cycle, and sequentially shifts each block in each frame period, by using k/2 scanning lines as a unit. Hereinafter, dividing into blocks in an M-th frame period (M is a natural number) and an (M+1)-th frame period will be described.

The dividing into blocks in the M-th frame period is similar to the dividing into blocks in the first embodiment. As shown in FIG. 2, the first block BL1 includes the scanning lines G1 to Gk of the first to k-th rows, and the emission lines E1 to Ek of the first to k-th rows. The second block BL2 includes the scanning lines Gk+1 to G2$k$ of the (k+1)-th to 2k-th rows, and the emission lines Ek+1 to E2$k$ of the (k+1)-th to 2k-th rows. The p-th block BLp includes the scanning lines Gn-k+1 to Gn of the (n-k+1)-th to n-th rows, and the emission lines En-k+1 to En of the (n-k+1)-th to n-th rows.

Figure 5:
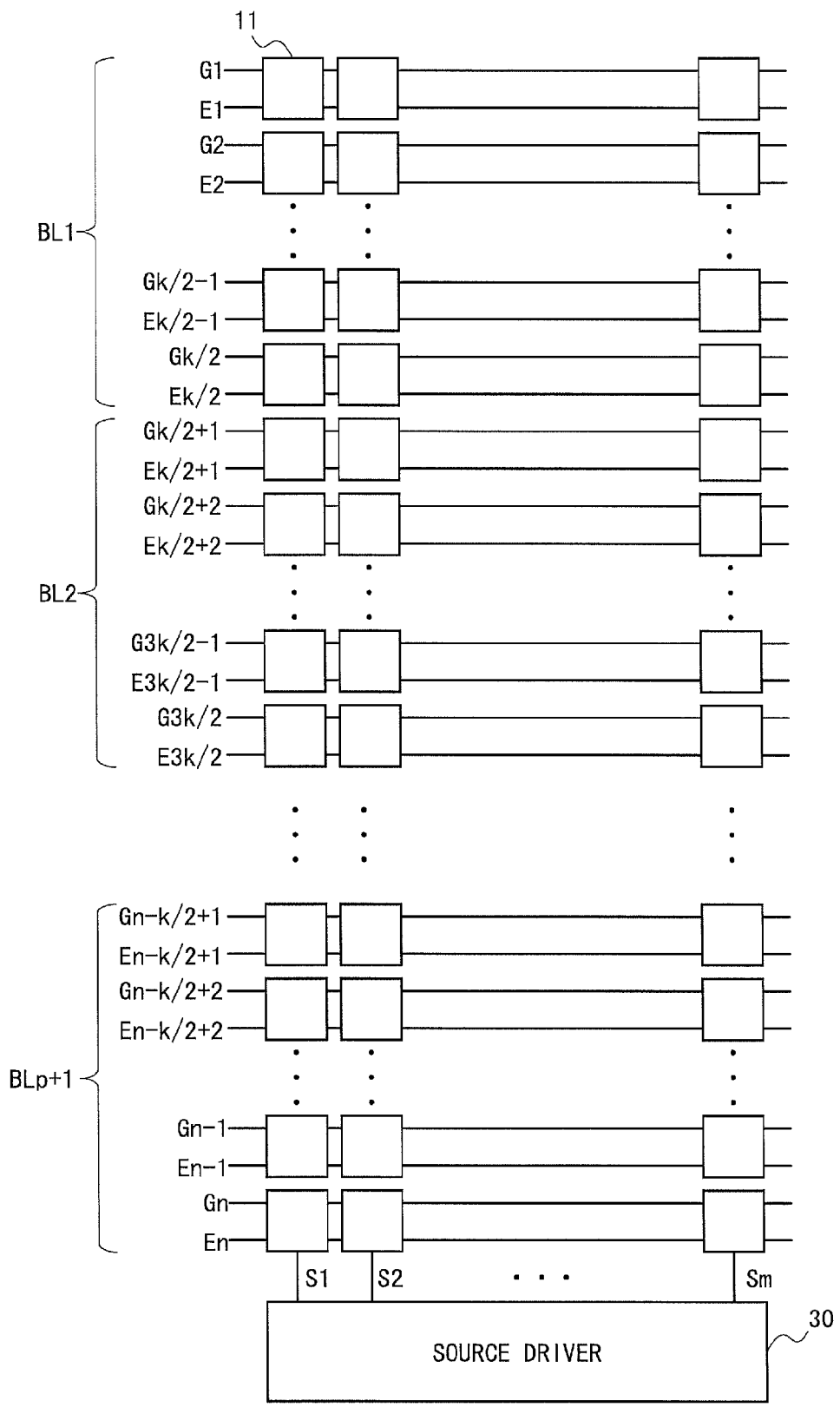
FIG. 5 is a block diagram for describing a dividing into blocks in an (M+1)-th frame period according to a modification of the first embodiment.

FIG. 5 is a block diagram for describing the dividing into blocks in the (M+1)-th frame period according to the present modification. In the (M+1)-th frame period, blocks increase by one, and a total number of blocks becomes (p+1). The first block BL1 includes the scanning lines G1 to Gk/2 of the first to k/2-th rows, and the emission lines E1 to Ek/2 of the first to k/2-th rows. The second block BL2 includes the scanning lines Gk/2+1 to G3$k$/2 of the (k/2+1)-th to 3k/2-th rows, and the emission lines Ek/2+1 to E3$k$/2 of the (k/2+1)-th to 3k/2-th rows. The (p+1)-th block BLp+1 includes the scanning lines Gn-k/2+1 to Gn of the (n-k/2+1)-th to n-th rows, and the emission lines En-k/2+1 to En of the (n-k/2+1)-th to n-th rows.

In the M-th frame period, from the first block BL1 of the top stage in the Y direction (hereinafter, simply referred to as the "top stage") to the p-th block BLp of the bottom stage in the Y direction (hereinafter, simply referred to as the "bottom stage"), the number of the scanning lines and the number of the emission lines included in each block (hereinafter, simply referred to as the "total number of wires", respectively) are k. On the other hand, in the (M+1)-th frame period, the total numbers of wires in the first block BL1 of the top stage and the (p+1)-th block BLp+1 of the bottom stage are k/2, respectively, and the total numbers of wires in other blocks are k. The second block BL2, the third block BL3, . . . , and the p-th block BLp in the (M+1)-th frame period are the first block BL1, the second block BL2, . . . , and the (p−1)-th block BLp−1 in the M-th frame period that are shifted by k/2 scanning lines, respectively. The (p+1)-th block BLp+1 and the first block BL1 in the (M+1)-th frame period are the blocks obtained by shifting the p-th block BLp in the M-th frame period by the k/2 scanning lines so as to divide the p-th block BLp into two blocks.

The dividing into blocks in the (M+2)-th frame period is similar to the dividing into blocks in the M-th frame period. However, the second block BL2, the third block BL3, . . . , and the p-th block BLp in the (M+2)-th frame period are the blocks obtained by shifting the second block BL2, the third block BL3, . . . , and the p-th block BLp in the (M+1)-th frame period by k/2 scanning lines. The first block BL1 in the (M+2)-th frame period is the block obtained by shifting the (p+1)-th block BLp+1 and the first block BL1 in the (M+1)-th frame period by k/2 scanning lines so as to integrate the (p+1)-th block BLp+1 and the first block BL1 into one block. In the present modification, the above operation is repeated by using two frame periods as one cycle.

According to the present modification, by using two frame periods as one cycle, each block is sequentially shifted in each one frame period, by using k/2 scanning lines as a unit. Therefore, it is possible to prevent a brightness boundary due to a difference between blocks of the average characteristic of the transistor T2 from being visually recognized.

An example has been described here wherein each block is sequentially shifted in each one frame period by using two frame periods as one cycle and by using k/2 scanning lines as a unit. However, the present invention is not limited to this. By using N frame periods (N is an integer not smaller than 2 and smaller than k) as one cycle, each block may be sequentially shifted in each one frame period as a unit of k/N. When N is close to k, visual recognition of a brightness boundary can be sufficiently suppressed. The shifting of each block is not limited to each one frame period, and each block may be shifted in each M frame period(s) (M is a natural number).

2. Second Embodiment

2.1 Detection/Correction Output Circuit

Figure 6:
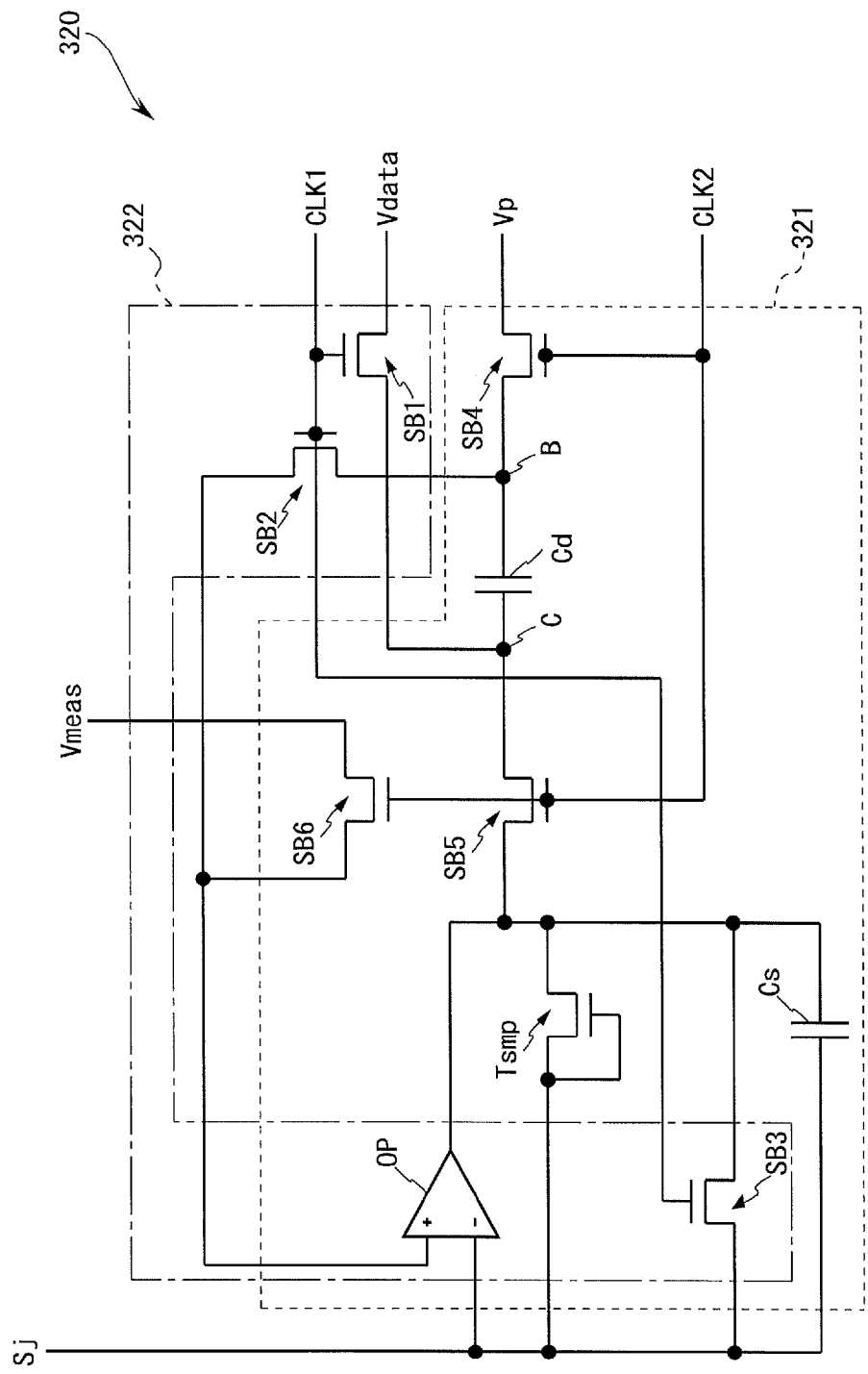
FIG. 6 is a circuit diagram showing a configuration of a detection/correction output circuit according to a second embodiment of the present invention.

FIG. 6 is a circuit diagram showing a configuration of a detection/correction output circuit 320 according to a second embodiment of the present invention. Out of the components of the present embodiment, components identical to those in the first embodiment are denoted by identical reference symbols, and their description will be appropriately omitted.

A configuration of the pixel circuit 11 in the present embodiment is similar to that in the first embodiment. The detection/correction output circuit 320 in the present embodiment includes the detecting unit 321, and the correction output unit 322. In the present embodiment, transmission of the third clock CLK3 from the control circuit 20 to the source driver 30 is not necessary.

The detecting unit 321 and the correction output unit 322 include in common one operational amplifier OP and one transistor SB3. In the present embodiment, the transistor SB3 corresponds to a control switch. The detecting unit 321 further includes four transistors Tsmp, SB4 to SB6, and two capacitors Cd and Cs. In the present embodiment, the transistor Tsmp corresponds to a load unit, the capacitor Cd corresponds to the correction capacitor element. The detection switch unit is realized by the transistors SB4 to SB6. The transistor Tsmp is a MOSFET, for example. The capacitor Cs is provided to stabilize the negative feedback of the operational amplifier OP. The correction output unit 322 further includes two transistors SB1 and SB2. In the present embodiment, the correction output switch unit is realized by the transistors SB1 and SB2. In FIG. 6, although the conductivity type of the transistors SB1 to SB6 is the n-channel type, the conductivity type may be the p-channel type. Further, in place of the transistors SB1 to SB6, other components or circuits having the switching function may be used.

The transistor SB1 has a gate terminal to which the first clock CLK1 is supplied, a first conductive terminal connected to one end of the capacitor Cd, and a second conductive terminal to which the data voltage Vdata is supplied. The transistor SB2 has a gate terminal to which the first clock CLK1 is supplied, a first conductive terminal connected to the other end of the capacitor Cd, and a second conductive terminal connected to a non-inverting input terminal of the operational amplifier OP. The transistor SB3 has a gate terminal to which the first clock CLK1 is supplied, and is provided between the output terminal of the operational amplifier OP and the data line Sj. The transistor SB4 has a gate terminal to which the second clock CLK2 is supplied, a first conductive terminal connected to the other terminal of the capacitor Cd, and a second conductive terminal to which the high-level power supply voltage Vp is supplied as a first fixed voltage. The transistor SB5 has a gate terminal to which the second clock CLK2 is supplied, and is provided between the one end of the capacitor Cd and the output terminal of the operational amplifier OP. The transistor SB6 has a gate terminal to which the second clock CLK2 is supplied, a first conductive terminal connected to the non-inverting input terminal of the operational amplifier OP, and a second conductive terminal to which a measurement voltage Vmeas is supplied as a second fixed voltage. The measurement voltage Vmeas is given from the control circuit 20 or other circuits not shown. The transistor Tsmp is of n-channel type, has a first conductive terminal and a gate terminal that are connected to the data line Sj, and has a second conductive terminal connected to the output terminal of the operational amplifier OP. In the transistor Tsmp, the first conductive terminal is a drain terminal, and the second conductive terminal is a source terminal. The transistor Tsmp is in a diode connection having the gate terminal and the drain terminal connected to each other. That is, in the present embodiment, a diode element configured by a MOSFET is realized by the transistor Tsmp. The inverting input terminal of the operational amplifier OP is connected to the data line Sj. The capacitor Cs is provided in parallel with the transistors SB3 and Tsmp, between the output terminal and the inverting input terminal of the operational amplifier OP.

Hereinafter, in the description concerning the present embodiment, a connection point between the other end of the capacitor Cd, the first conductive terminal of the transistor SB2, and the first conductive terminal of the transistor SB4 will be called a "second node B", for the sake of convenience. Further, a connection point between the one end of the capacitor Cd, the first conductive terminal of the transistor SB1, and the conductive terminal of the transistor SB5 positioned at one end side of the capacitor Cd will be called a "third node C", for the sake of convenience.

2.2 Operation

Figure 7:
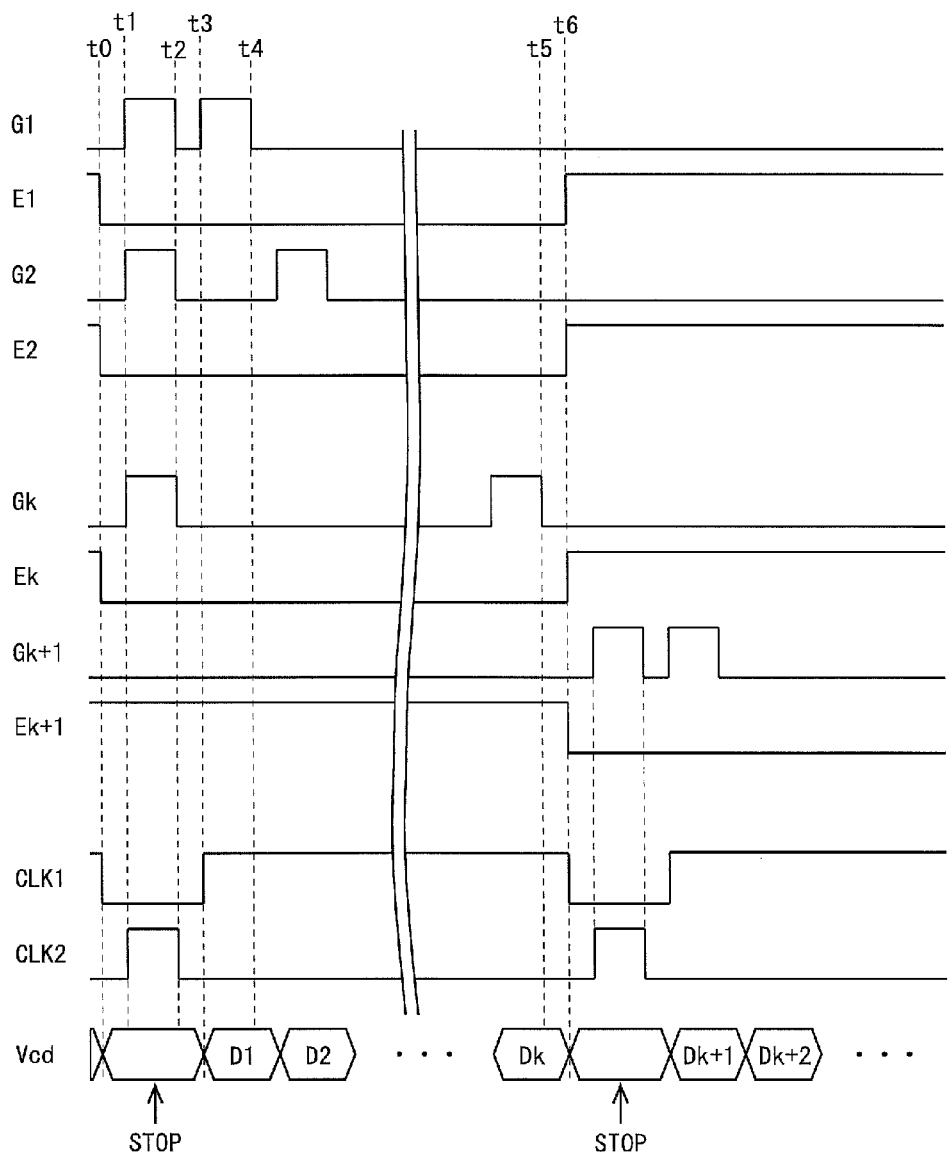
FIG. 7 is a timing chart for describing operation of a pixel circuit and the detection/correction output circuit according to the second embodiment.

FIG. 7 is a timing chart for describing operation of the pixel circuit 11 and the detection/correction output circuit 320 according to the present embodiment. In FIG. 7, a period from time t1 to time t5 is a block selection period of the first block BL1, and a period from time t1 to time t2 is a common selection period and is also a detection period, and a period from time t3 to time t5 is a scanning period.

Before time t0, the potentials of the scanning lines G1 to Gk of the first to k-th rows are at the low levels, and the potentials of the emission lines E1 to Ek of the first to k-th rows are at the high levels. The first clock CLK1 is at the high level, and the second clock CLK2 is at the low level. At this time, in the pixel circuits 11 of the first to k-th rows, the transistors T1 and T3 are in the off state and the transistor T4 is in the on state. Therefore, the transistor T2 is supplying the driving current Ioled corresponding to the gate-source voltage VgsT2 held in the capacitor C1, to the organic EL element EL. Consequently, the organic EL element EL is emitting light in the brightness in accordance with the driving current Ioled. At this time, the transistors SB4 to SB6 are in the off state, and the transistors SB1 to SB3 are in the on state. Therefore, the corrected data voltage Vcd corresponding to each row is sequentially supplied from the operational amplifier OP to the data line Sj. The supply of the corrected data voltage Vcd from the operational amplifier OP to the data line Sj will be described in detail later.

At time t0, the potentials of the emission lines E1 to Ek of the first to k-th rows change to the low levels. Therefore, in the pixel circuits 11 of the first to k-th rows, the transistors T4 are turned off. Consequently, because the anode terminal of the organic EL element EL and the source terminal of the transistor T2 are electrically disconnected from each other, the supply of the driving current Ioled to the organic EL element EL stops. Accordingly, the light emission of the organic EL element EL stops. At this time, because the first clock CLK1 changes to the low level, the transistors SB1 to SB3 are turned off. Consequently, the supply of the corrected data voltage Vcd to the data line Sj stops. The potentials of the emission lines E1 to Ek of the first to k-th rows are maintained at the low levels until time t6.

At time t1, because the potentials of the scanning lines G1 to Gk of the first to k-th rows change to the high levels, the transistors T1 and T3 are turned on in the pixel circuits 11 of the first to k-th rows. Further, because the second clock CLK2 changes to the high level, the transistors SB4 to SB6 are turned on. Therefore, the measurement voltage Vmeas is given to the non-inverting input terminal of the operational amplifier OP, the high-level power supply voltage Vp is given to the second node B, the third node C is connected to the output terminal of the operational amplifier OP and to the source terminal of the transistor Tsmp, and the data line Sj connected to the inverting input terminal of the operational amplifier OP is charged to the measurement voltage Vmeas by a virtual short-circuit of the operational amplifier OP. Accordingly, the potential of the first node A becomes Vmeas, and the capacitor C1 is charged to the gate-source voltage VgsT2 given by the following equation (9).

$$VgsT2 = Vp - Vmeas \qquad (9)$$

Here, the measurement voltage Vmeas is set such that the gate-source voltage VgsT2 expressed by the equation (9) becomes a level at which the transistor T2 is set to the on state.

In the detection period from time t1 to time t2, because the transistor SB3 is in the off state (because the control switch is opened), the operational amplifier OP and the transistor Tsmp function as a transimpedance circuit. Specifically, from the pixel circuits 11 of the first to k-th rows, the driving current Ioled corresponding to the gate-source voltage VgsT2 expressed by the equation (9) flows to the transistor Tsmp via the transistor T1 and the data line Sj, and the driving current Ioled is converted to a voltage by the transistor Tsmp. Then, the converted voltage becomes an output voltage Vout of the operational amplifier OP. That is, the output voltage Vout of the operational amplifier OP is obtained based on the driving current Ioled. In the period from time t1 to time t2, because the transistor T4 is in the off state, the driving current Ioled does not flow to the organic EL element EL. Accordingly, the output voltage Vout based on the driving current Ioled can be obtained reliably. Here, for the sake of convenience, the driving currents Ioled that flow to the transistors T2 and Tsmp are respectively expressed by IT2 and ITsmp, the gains of the transistors T2 and Tsmp are respectively expressed by $\beta T2$ and $\beta Tsmp$, and the gate-source voltage of the transistor Tsmp is expressed by VgsTsmp. The driving currents IT2 and ITsmp in the period from time t1 to time t2 are respectively given by the equation (10) and the equation (11).

$$IT2 = (\beta T2/2)^*(VgsT2 - VthT2)^2 \qquad (10)$$

$$ITsmp = (\beta Tsmp/2)^*(VgsTsmp - VthTsmp)^2 \qquad (11)$$

Here, when the driving currents Ioled of the pixel circuits 11 of the first to k-th rows are equal to each other, and also when the gain of the transistor Tsmp (that is, the current supply capacity) is approximately equal to k times of the gain of the transistor T2 (that is, $k^*\beta T2 = \beta Tsmp$), because $k^*IT2 = ITsmp$, the gate-source voltage VgsTsmp of the transistor Tsmp is given by the following equation (12).

$$VgsTsmp = VgsT2 - VthT2 + VthTsmp \qquad (12)$$
$$= Vp - Vmeas - VthT2 + VthTsmp$$

At this time, the output voltage Vout of the operational amplifier OP is given by the following equation (13).

$$Vout = Vmeas - VgsTsmp \qquad (13)$$
$$= 2Vmeas - Vp + VthT2 - VthTsmp$$

In the equation (13), when it is assumed that there are no variation and no temporal change of VthTsmp, because terms other than VthT2 are constants, the output voltage Vout of the operational amplifier OP corresponding to the threshold voltage VthT2 of the transistor T2 is given to the one end of the capacitor Cd. In this way, the output voltage Vout of the operational amplifier OP corresponding to the threshold voltage VthT2 of the transistor 12 is directly obtained from the driving current. On the other hand, because the high-level power supply voltage Vp is given to the second node B via the transistor SB4, the potential of the second node B becomes Vp. In other words, the high-level power supply voltage Vp is given to the other end of the capacitor Cd. In this way, in the detection period, the capacitor Cd is charged to the correction voltage Vd given by the following equation (14).

$$Vd = Vout - Vp \qquad (14)$$
$$= 2Vmeas - Vp + VthT2 - VthTsmp$$

As described above, because terms other than VthT2 are constants, the correction voltage Vd which is a linear function of VthT2 is held in the capacitor Cd. The correction voltage Vd expressed in the equation (14) is obtained taking the second node B as the base.

At time t2, because the potentials of the scanning lines G1 to Gk of the first to k-th rows change to the low levels, the transistors T1 and T3 are turned off in the pixel circuits 11 of the first to k-th rows. At this time, the threshold voltage VthT2 of the transistor T2 is being held in the capacitor C1. Because the second clock CLK2 changes to the low level, the transistors SB4 to SB6 are turned off. At this time, the correction voltage Vd is being held in the capacitor Cd.

At time t3, because the first clock CLK1 changes to the high level, the transistors SB1 to SB3 are turned on. In this way, because the transistor SB3 becomes in the on state (the control switch closes), the operational amplifier OP functions as a buffer amplifier. Further, because the data voltage Vdata is given to the third node C via the transistor SB1, the corrected data voltage Vcd given by the following equation (15) is supplied to the data line Sj via the operational amplifier OP that functions as the buffer amplifier.

$$Vcd = Vdata - Vd \qquad (15)$$
$$= Vdata - 2Vmeas + 2Vp - VthT2 + VthTsmp$$

In this way, the corrected data voltage Vcd is obtained by subtracting the corrected voltage Vd held in the capacitor Cd from the data voltage Vdata. In other words, by offset-correcting the data voltage Vdata using the correction voltage Vd, the corrected data voltage Vcd is obtained. When the third node C is taken as the base of the correction voltage Vd, the corrected data voltage Vcd is obtained by adding the correction voltage Vd held in the capacitor Cd to the data voltage Vdata. At time t3, because the potential of the scanning line G1 of the first row changes to the high level, the transistors T1 and T3 are turned on in the pixel circuits 11 of the first row. The corrected data voltage Vcd is written to the pixel circuits 11 of the first row, so that the potential of the first node A becomes Vcd and the gate potential of the transistor T2 becomes Vp. Accordingly, the capacitor C1 is charged to the gate-source voltage VgsT2 given by the following equation (16).

$$VgsT2 = Vp - Vcd \qquad (16)$$
$$= -Vdata + 2Vmeas - Vp + VthT2 - VthTsmp$$

At time t4, because the potential of the scanning line G1 of the first row changes to the low level, the transistors T1 and T3 are turned off in the pixel circuit 11 of the first row. Therefore, the gate-source voltage VgsT2 held in the capacitor C1 is fixed at the value indicated by the equation (16). Thereafter, the scanning lines G2 to Gk of the second to k-th rows are sequentially selected (the potentials become at the high levels) in the scanning period up to time t5, so that the corrected data voltage Vcd is written into the pixel circuit 11 of each row.

At time t6, because the potentials of the emission lines E1 to Ek of the first to k-th rows change to the high levels, the transistors T4 of the pixel circuits 11 of the first to k-th rows are turned on. Therefore, the anode terminal of the organic EL element EL and the source terminal of the transistor T2 are electrically connected to each other. Consequently, the transistor T2 supplies the driving current Ioled given by the following equation (17) to the organic EL element EL.

$$Ioled = (\beta/2) * (VgsT2 - VthT2)^2 \quad (17)$$
$$= (\beta/2) * (-Vdata + 2Vmeas - Vp - VthTsmp)^2$$

As expressed by the equation (17), because the gate-source voltage VgsT2 is set to the value expressed by the equation (16), the driving current Ioled becomes the value independent from the threshold voltage VthT2 of the transistor T2. In this way, because the variation of the threshold voltage is compensated for, a brightness variation is suppressed. Terms other than −Vdata in the equation (17) are constants.

At time t6, further, the potentials of the emission lines Ek+1 to E2k of the (k+1) to 2k-th rows that are included in the second block BL2 change to the low levels, and thereafter, operation similar to that in the first block BL1 is performed for the second block BL2. In the third block BL3 and thereafter, operation similar to that in the first block BL1 is also performed. In this way, the selection block is sequentially shifted, and detection of the threshold voltages VthT2 and writing of the corrected data voltages Vcd in the pixel circuits 11 of all rows come to an end. By repeating the above operation, image display without a brightness variation is performed.

It has been assumed above that at time t1, the potentials of the scanning lines G1 to Gk of the first to k-th rows change to the high levels and the second clock CLK2 changes to the high level at the same time. However, it may be arranged such that after the potentials of the scanning lines G1 to Gk of the first to k-th rows change to the high levels, the second clock CLK2 changes to the high level. Further, time t2 and time t3 may be coincided with each other.

The transistor Tsmp in the source driver 30 is formed in a process separate from that of the transistor T2 in the pixel circuit 11. Therefore, in the process of forming the transistor Tsmp, a gate length L, a gate width W, and the like may be adjusted such that the gain of the transistor Tsmp coincides with k times of the gain of the transistor T2. Specifically, in order to make the gain of the transistor Tsmp coincide with k times of the gain of the transistor T2, the aspect ratio (W/L) of the transistor Tsmp may be set smaller than the aspect ratio of the transistor T2. When it is difficult to make the gain of the transistor Tsmp coincide with k times of the gain of the transistor T2, or in the case of using a diffusion resistance (also referred to as a diffusion layer resistance) as the load unit in place of the transistor Tsmp, an analog or digital process using various kinds of amplifier circuits may be performed, for example, such that a voltage corresponding to the threshold voltage VthT2 of the transistor T2 is given to the one end of the capacitor Cd. The means for giving a voltage corresponding to the threshold voltage VthT2 of the transistor T2 to the one end of the capacitor Cd can be changed variously.

2.3 Operation

According to the present embodiment, in the common selection period (detection period), because the transistor SB3 becomes in the off state, the operational amplifier OP and the transistor Tsmp function as the transimpedance circuit. Therefore, by the operation of the detection switch unit realized by the transistors SB4 to SB6, the capacitor Cd is charged to the correction voltage Vd. In the scanning period, because the transistor SB3 becomes in the on state, the operational amplifier OP functions as the backup amplifier. Therefore, by the operation of the correction output switch unit realized by the transistors SB1 and SB2, the corrected data voltage Vcd obtained by offset-correcting the data voltage Vdata by using the correction voltage Vd is supplied to the data line Sj. Consequently, an effect similar to that of the first embodiment can be obtained. Further, by using the transimpedance circuit, the capacitor Cd can be charged to the correction voltage Vd at a high speed.

Further, in the present embodiment, because the transistor Tsmp that functions as the diode element is used, by logarithmically converting the driving current, the output voltage Vout of the operational amplifier OP corresponding to the threshold voltage VthT2 of the transistor T2 can be obtained. More specifically, because the gain of the transistor Tsmp is approximately equal to k times of the gain of the transistor T2, the output voltage Vout of the operational amplifier OP corresponding to the threshold voltage VthT2 of the transistor T2 can be obtained directly from the driving current.

According to the present embodiment, for example, by adjusting the aspect ratio of the transistor Tsmp, the gain of the transistor Tsmp can be set approximately equal to k times of the gain of the transistor T2.

3. Third Embodiment

3.1 Pixel Circuit

Figure 8:
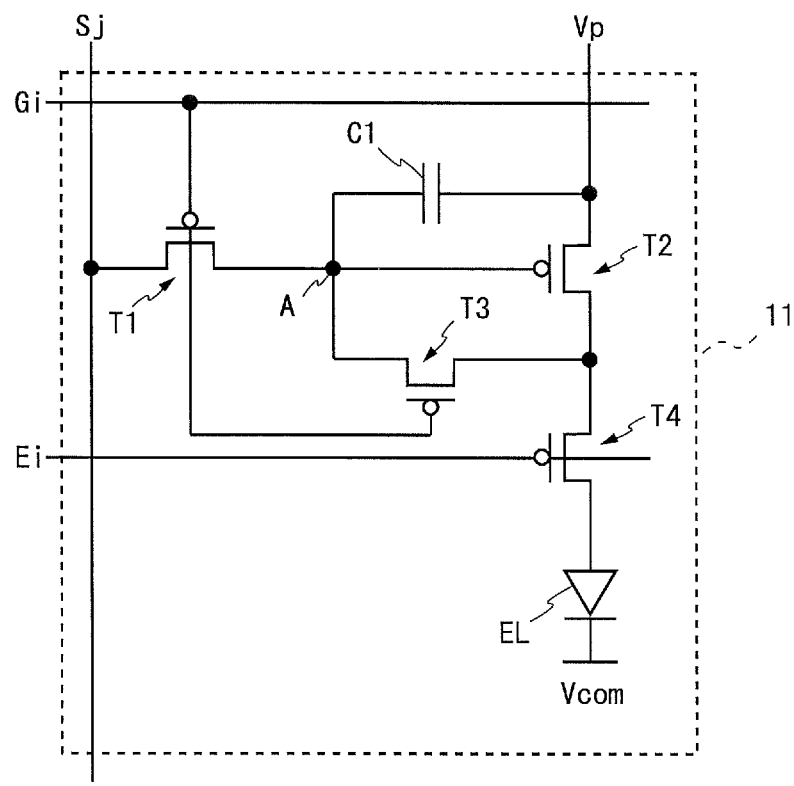
FIG. 8 is a circuit diagram showing a configuration of a pixel circuit according to a third embodiment of the present invention.

FIG. 8 is a circuit diagram showing a configuration of the pixel circuit 11 according to the present embodiment. Out of the components of the present embodiment, components identical to those in the first embodiment denoted by identical reference symbols, and their description will be appropriately omitted. Here, the pixel circuit 11 shown in FIG. 8 is the pixel circuit 11 in the i-th row and j-th column. A configuration of the detection/correction output circuit 320 in the present embodiment is assumed to be similar to that of the first embodiment. However, the configuration of the detection/correction output circuit 320 in the present embodiment may be similar to that of the second embodiment.

The pixel circuit 11 includes one organic EL element EL, four transistors T1 to T4, and one capacitor C1. The transistor T1 is an input transistor, the transistor T2 is a driving transistor, the transistor T3 is a current-path forming transistor, and the transistor T4 is a light emission control transistor. The capacitor C1 corresponds to a driving capacitor element. The transistors T1 to T4 are all of p-channel type, and are low-temperature polysilicon TFTs or amorphous silicon TFTs, for example. The transistors T1 to T4 may be oxide TFTs such as IGZO-TFTs.

The transistor T2 is connected in series with the organic EL element EL, and has, as a first conductive terminal, the source terminal connected to the high-level power supply line Vp. The transistor T1 has a gate terminal connected to the scanning line Gi, and is provided between a gate terminal of the transistor T2 and the data line Sj. The transistor T3 has a gate terminal connected to the scanning line Gi, and is provided between the drain terminal as the second conductive terminal and the gate terminal of the transistor T2. The transistor T4 has agate terminal connected to the emission line Ei, and is provided between the drain terminal of the transistor T2 and the anode terminal of the organic EL element EL. The capacitor C1 has one end connected to the source terminal of the transistor T2 and has the other end connected to the gate terminal of the transistor T2. The cathode terminal of the organic EL element EL is connected to the low-level power supply line Vcom. Hereinafter, in the description concerning the present embodiment, a connection point between the gate terminal of the transistor T2, the one end of the capacitor C1, the conductive terminal of the transistor T1 positioned at the gate terminal side of the transistor T2, and the conductive terminal of the transistor T3 positioned at the gate terminal side of the transistor T2 will be called a "first node A", for the sake of convenience.

3.2 Operation

Figure 9:
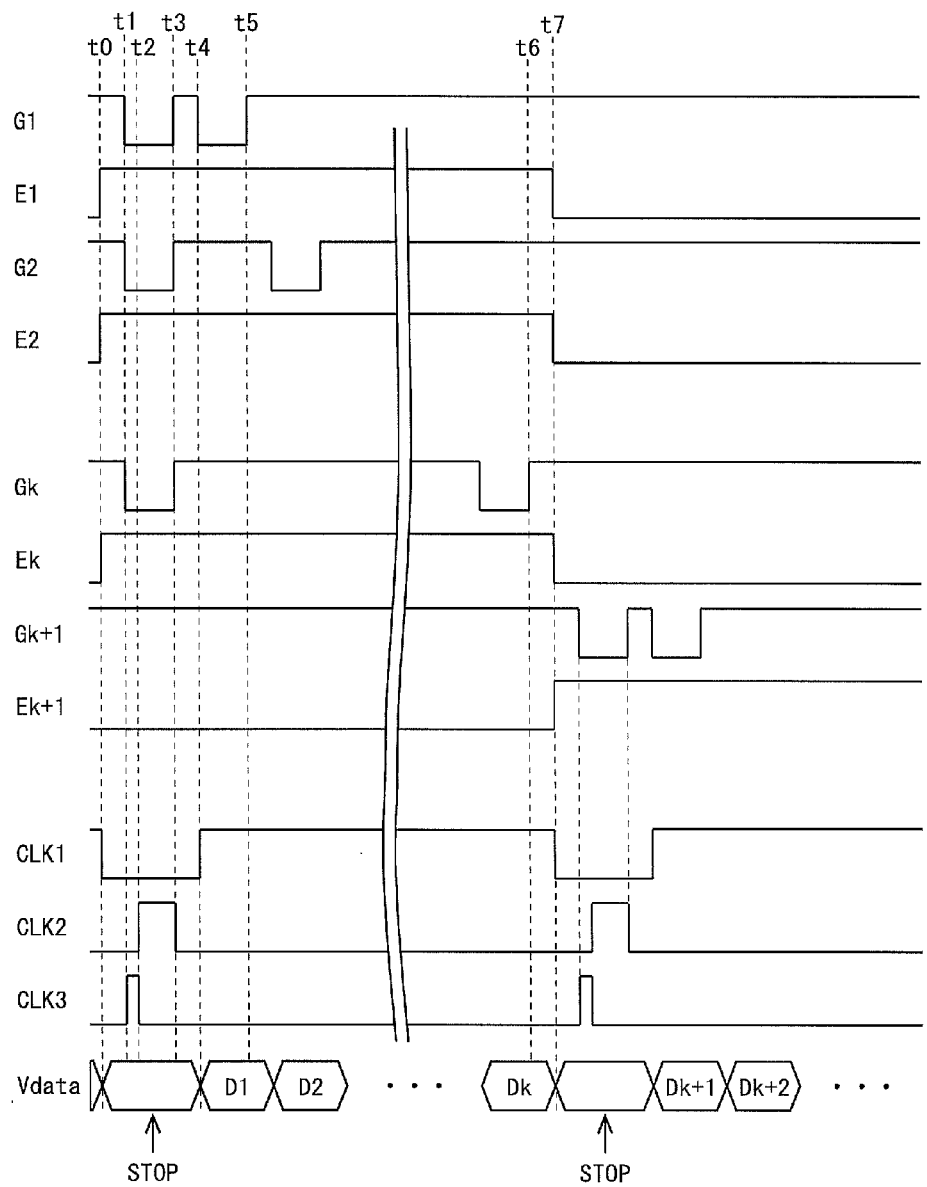
FIG. 9 is a timing chart for describing operation of the pixel circuit and the detection/correction output circuit according to the third embodiment.

FIG. 9 is a timing chart for describing operation of the pixel circuit 11 and the detection/correction output circuit 320 according to the present embodiment. The operation of the detection/correction output circuit 320 in the present embodiment is similar to the operation in the first embodiment. Therefore, hereinafter, a description of the operation of the detection/correction output circuit 320 will be appropriately omitted. Further, because the transistors T1, T3, and T4 are of p-channel type, the potentials of the scanning lines and the emission lines are reversed potentials of the first embodiment, and the scanning lines of the present embodiment become in the selection state when the potentials are at the low levels. Hereinafter, in the case where a difference of the operation from the operation of the first embodiment is in only the potentials of the scanning lines and/or emission lines, a description of the operation of the pixel circuit 11 will be appropriately omitted.

Operation before time t0 and at time t0 is basically similar to the operation of the first embodiment. At time t1, the data line Sj is charged to the reset voltage Vreset, and the potential of the first node A becomes Vreset. Because the high-level power supply voltage Vp is being given to the source terminal of the transistor T2 (the other end of the capacitor C1), the capacitor C1 is charged to the gate-source voltage VgsT2 given by the above equation (1).

At time t2, in the pixel circuits 11 of the first to k-th rows, the driving current Ioled flows sequentially through the transistor T2, the transistor T3, the first node A, the transistor T1, and the data line Sj, and the potential of the first node A increases while the transistor T2 is in the on state. Therefore, like in the first embodiment, in the detection period, the capacitor Cd is charged to the correction voltage Vd given by the above equation (2). Thereafter, in a period from time t3 to time t6, the operation similar to that of the first embodiment is performed. At time t7, like in the first embodiment, the driving current Ioled given by the above equation (5) is supplied to the organic EL element EL. By repeating the above operation, image display without a brightness variation is performed.

3.3 Effect

According to the present embodiment, an effect similar to that of the first embodiment can be obtained in the organic EL display device 1 provided with the pixel circuit 11 including one organic EL element EL, four p-channel type transistors T1 to T4, and one capacitor C1.

4. Fourth Embodiment

4.1 Dividing into Blocks

The driving transistor (transistor T2) included in the pixel circuit 11 according to a fourth embodiment of the present invention is a transistor to which an annealing process using laser light is performed at a time of formation, for example a low-temperature polysilicon TFT. Out of the components of the present embodiment, components identical to those in the first embodiment are denoted by identical reference symbols, and their description will be appropriately omitted. In the present embodiment, the dividing into blocks is performed considering a direction of each scanning of the laser light in the annealing process (hereinafter, referred to as the "considering the annealing process"). Here, "each scanning of the laser light in the annealing process" means a scanning of one row or one column that is performed by continuously irradiating the laser light to the substrate that configures the display unit 10, along the X direction or the Y direction. The configuration of the pixel circuit 11 according to the present embodiment may be either the configuration in the first embodiment or the configuration in the third embodiment.

Figure 10:
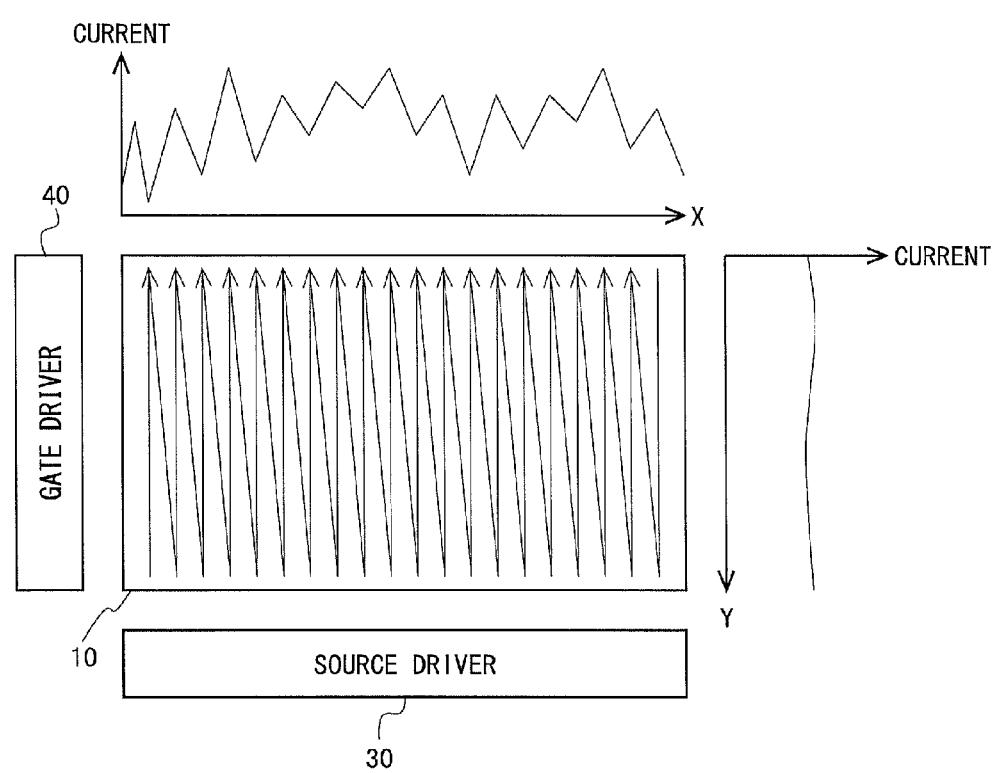
FIG. 10 is a diagram for describing a dividing into blocks considering a direction of each scanning of laser light in an annealing process according to a fourth embodiment of the present invention.

FIG. 10 is a diagram for describing the dividing into blocks considering the annealing process in the present embodiment. Concerning the annealing process, it has been known that, in a direction of each scanning of the laser light, characteristics (driving current) are made approximately uniform between transistors to which the annealing process is performed in the same scanning, and that, in the direction that strides over a direction of each scanning of the laser light, characteristics vary between the transistors. Considering the above, in the present embodiment, the data lines and the scanning lines are arranged in the display unit 10 such that the Y direction is along a direction of each scanning of the laser light in the annealing process, and the X direction is along the direction that strides over a direction of each scanning of the laser light, and the source driver 30 and the gate driver 40 are disposed corresponding to the data lines and the scanning lines.

4.2 Effect

According to the present embodiment, k scanning lines arranged in scanning directions of laser light in the annealing process are included in one block. Because characteristics of the transistors T2 are made approximately uniform in scanning directions of laser light, an average characteristic of k transistors T2 corresponding to each block get closer to respective characteristics of the k transistors T2. Accordingly, for each block, compensation accuracy of a characteristic variation of the transistors T2 can be increased.

5. Fifth Embodiment

5.1 Source Driver

In the first embodiment, the driving signal generation circuit 31 in the source driver 30 includes m detection/correction output circuits 320. However, in a fifth embodiment of the present invention, the driving signal generation circuit 31 in the source driver 30 includes m/h detection/correction output circuits 320. Here, h is an integer not smaller than 2 and smaller than m, and it is assumed below that h=3.

Figure 11:
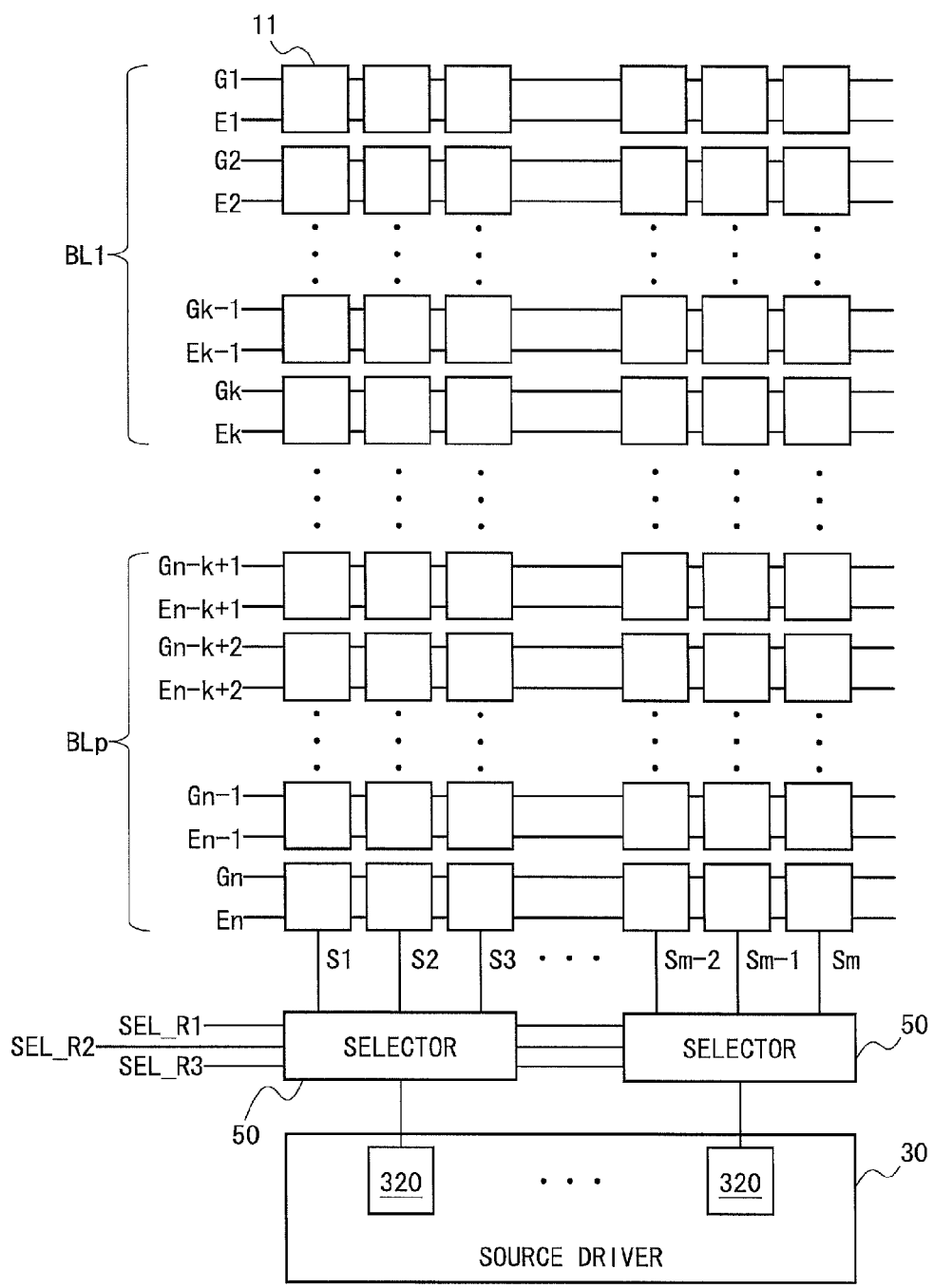
FIG. 11 is a block diagram for describing connection between source drivers and data lines according to a fifth embodiment of the present invention.

FIG. 11 is a block diagram for describing connection between the source drivers 30 and the data lines according to the fifth embodiment of the present invention. Out of the components of the present embodiment, components identical to those in the first embodiment are denoted by identical reference symbols, and their description will be appropriately omitted. The organic EL display device 1 according to the present embodiment includes m/h selectors 50. Each detection/correction output circuit 320 is connected to h (three) data lines via the selector 50. Hereinafter, for the convenience of descriptions, a description will be made by focusing attention on data lines S1 to S3 of the first to third columns and the selector 50 connected to these data lines, and a description concerning other data lines and the selector 50 will be appropriately omitted. It is assumed that configurations of the detection/correction output circuit 320 and the pixel circuit 11 are similar to those in the first embodiment. However, in the present embodiment, the detection/correction output circuit 320 in the second embodiment and/or the pixel circuit 11 in the third embodiment may be employed.

The selector 50 receives first to third selection control signals SEL_R1 to SEL_R3, and controls, based on the signals, connections between the data lines S1 to S3 of the first to third columns and the detection/correction output circuit 320. The first to third selection control signals SEL_R1 to SEL_R3 are generated by the control circuit 20, for example.

5.2 Operation

Figure 12:
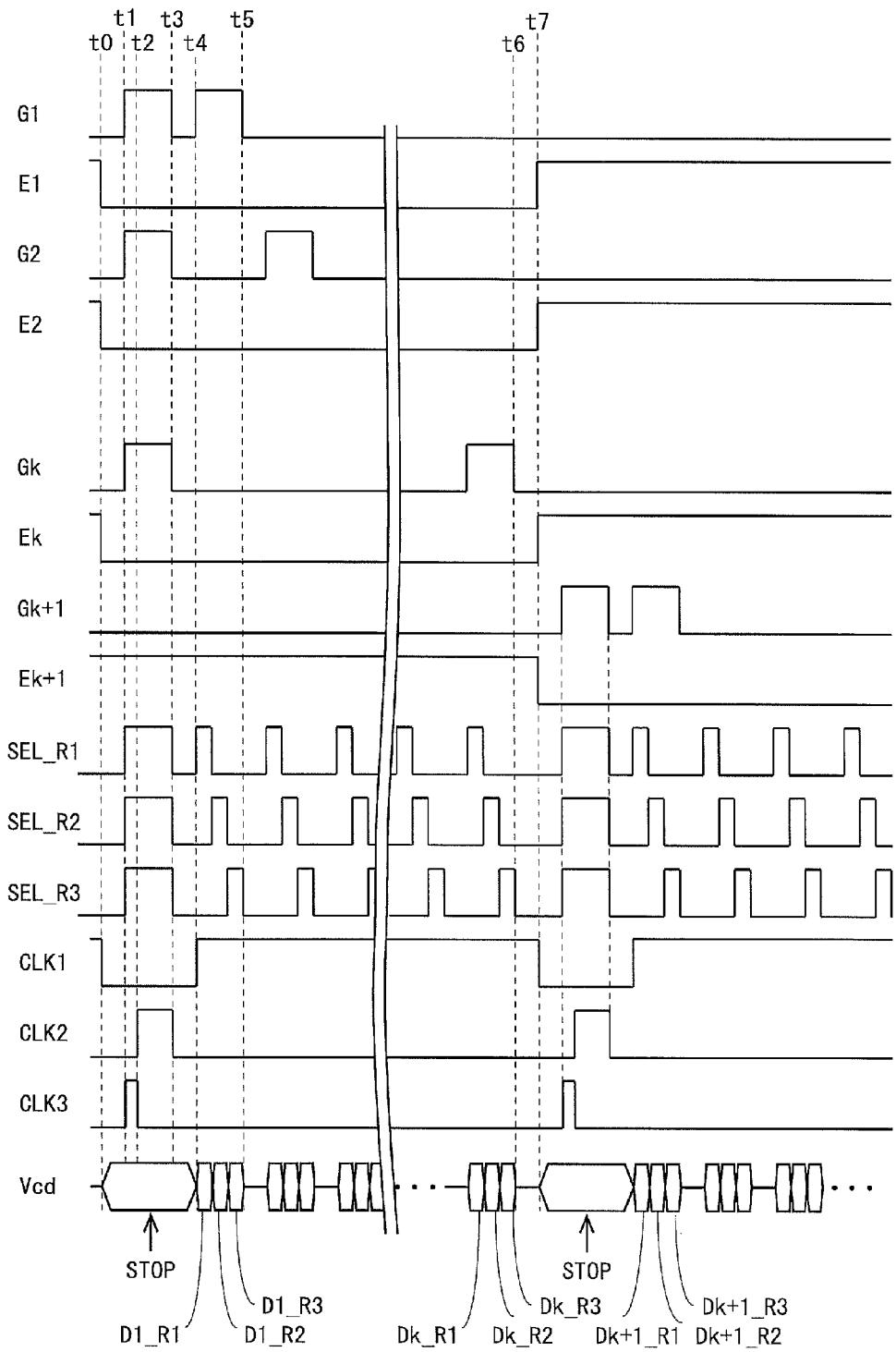
FIG. 12 is a timing chart for describing operation of a pixel circuit, a selector, and a detection/correction output circuit according to the fifth embodiment.

FIG. 12 is a timing chart for describing operation of the pixel circuit 11, the selector 50, and the detection/correction output circuit 320 according to the present embodiment. A period from time t1 to time t6 is a block selection period of the first block BL1, a period from time t1 to time t3 is a common selection period, a period from time t4 to time t6 is a scanning period, a period from time t1 to time t2 is a reset period, and a period from time t2 to time t3 is a detection period. In FIG. 12, symbols Di_R1 to Di_R3 (i=1 to n) denote respectively that the corrected data voltage Vcd is based on gradation data corresponding to the i-th row and the first to third columns. The operation in the present embodiment is basically similar to that in the first embodiment, except the operation concerning the first to third selection control signals SEL_R1 to SEL_R3 and the corrected data voltage Vcd. Therefore, a description of portions common to those in the first embodiment will be appropriately omitted. Hereinafter, it is assumed that when the first to third selection control signals SEL_R1 to SEL_R3 are at the high levels, the data lines S1 to S3 of the first to third columns and the detection/correction output circuit 320 are electrically connected to each other, and that when the first to third selection control signals SEL_R1 to SEL_R3 are at the low levels, the data lines S1 to S3 of the first to third columns and the detection/correction output circuit 320 are electrically disconnected from each other. However, the high levels and the low levels may be opposite.

In the period from time t1 to time t3, the first to third selection control signals SEL_R1 to SEL_R3 are at the high levels, and in the first column to the third column, the operation similar to that in the j-th column in the first embodiment is performed, and the correction voltage Vd common to the first column to the third column is obtained. VthT2 reflected in the potential of the third node C in the present embodiment is an average value of the threshold voltages VthT2 of the transistors T2 included respectively in (k×h) (that is, k×3) pixel circuits 11 included in the first block BL1. However, as described above, because characteristics of the adjacent IGZO-TFTs are approximately uniform, it is possible to assume that the threshold voltages VthT2 of the transistors T2 are equal to each other in the (k×3) pixel circuits 11. Further, as described above, also in the case where the transistor T2 is a TFT other than an IGZO-TFT, it is possible to make an assumption similar to the case where the transistor T2 is an IGZO-TFT.

In the period from time t4 to time t5, the first to third selection control signals SEL_R1 to SEL_R3 sequentially become at the high levels. When the first selection control signal SEL_R1 is at the high level, the data line S1 of the first column and the detection/correction output circuit 320 are electrically connected to each other, and writing of the corrected data voltage D1_R1 is performed. When the second selection control signal SEL_R2 is at the high level, the data line S2 of the second column and the detection/correction output circuit 320 are electrically connected to each other, and writing of the corrected data voltage D1_R2 is performed. When the third selection control signal SEL_R3 is at the high level, the data line S3 of the third column and the detection/correction output circuit 320 are electrically connected to each other, and writing of the corrected data voltage D1_R3 is performed. In the corrected data voltages D1_R1 to D1_R3, the common correction voltage Vd is reflected. Operation in the period from time t5 to time t7 is similar to that in the first embodiment. By repeating the above operation, image display without a brightness variation is performed like in the first embodiment.

5.3 Effect

According to the present embodiment, because the detection/correction output circuit 320 is provided in common to the h (three) data lines, a circuit scale of the source driver 30 can be reduced. Although an average characteristic or a representative characteristic of the transistors T2 corresponding to each block is detected in every three data lines, sufficient compensation accuracy can be maintained when characteristics between adjacent driving transistors T2 are approximately uniform.

6. Others

The present invention is not limited to the above embodiments, and can be implemented by variously modifying within a range not departing from the gist of the present invention. For example, in the above embodiments, although it has been described that threshold voltage compensation is performed by detecting only the threshold voltage VthT2 as a characteristic of the transistor T2, the present invention is not limited to this. Threshold voltage compensation and compensation of a variation in mobility (hereinafter, referred to as the "mobility compensation") may be performed, by detecting the threshold voltage VthT2 and mobility as a characteristic of the transistor T2. Further, mobility compensation may be performed, by detecting only mobility as a characteristic of the transistor T2.

In the detection period, by selecting only a part of scanning lines (one scanning line may be selectable) included in the block, and by detecting a characteristic of the transistor T2 in the pixel circuit 11 corresponding to the scanning line, as a representative characteristic of the k transistors T2 included in the block, compensation may be performed based on a result of the detection.

The number of blocks may be one as described above. In this case, an average characteristic or a representative characteristic of n transistors T2 arranged in the Y direction is detected, and compensation is performed based on a result of the detection.

The common selection period may be provided after the scanning period. In this case, the correction voltage Vd detected in a certain common selection period is reflected in the corrected data voltage Vcd in the frame period next to the frame period that includes the common selection period.

To each of the second conductive terminal of the transistor SA2 in the first embodiment and the second conductive terminal of the transistor SB4 in the second embodiment, other fixed voltage may be given in place of the high-level power supply voltage Vp. Also in this case, the driving current baled becomes the value independent from the threshold voltage VthT2 of the transistor T2. Therefore, compensation similar to that in the first and second embodiments can be performed.

By not using the transistor T4, supply of the driving current Ioled to the organic EL element EL may be controlled, by adjusting the potential of the second conductive terminal (the source terminal in the first embodiment, and the drain terminal in the third embodiment) of the transistor T2.

INDUSTRIAL APPLICABILITY

Because the display device of the present invention has a feature that it is possible to compensate for a characteristic variation of a driving transistor while solving a shortage of writing time, the display device of the present invention can be utilized for a display device including a pixel circuit that includes an electro-optic element such as an organic EL display device.

DESCRIPTION OF REFERENCE CHARACTERS

1: ORGANIC EL DISPLAY DEVICE
10: DISPLAY UNIT
11: PIXEL CIRCUIT
20: CONTROL CIRCUIT
30: SOURCE DRIVER (DATA DRIVING UNIT)
32: DETECTION/CORRECTION OUTPUT UNIT
40: GATE DRIVER (SCANNING DRIVING UNIT)
320: DETECTION/CORRECTION OUTPUT CIRCUIT
321: DETECTING UNIT
322: CORRECTION OUTPUT UNIT
323: RESET UNIT (FIXED VOLTAGE SUPPLY UNIT)
S1 to Sm: DATA LINE
G1 to Gn: SCANNING LINE
E1 to En: EMISSION LINE
BL: BLOCK
T1 to T4, Tsmp, SA1 to SA5, SB1 to SB6: TRANSISTOR
EL: ORGANIC EL ELEMENT
C1: CAPACITOR (DRIVING CAPACITOR ELEMENT)
Cd: CAPACITOR (CORRECTION CAPACITOR ELEMENT)
BAP: BUFFER AMPLIFIER
OP: OPERATIONAL AMPLIFIER
Vp: HIGH-LEVEL POWER SUPPLY VOLTAGE (FIRST FIXED VOLTAGE)
Vcom: LOW-LEVEL POWER SUPPLY VOLTAGE
Vreset: RESET VOLTAGE (SECOND FIXED VOLTAGE)
Vmeas: MEASUREMENT VOLTAGE (SECOND FIXED VOLTAGE)

The invention claimed is:

1. An active matrix-type display device comprising:
   a display unit including a plurality of data lines, a plurality of scanning lines, and a plurality of pixel circuits disposed corresponding to the plurality of data lines and the plurality of scanning lines;
   a data driving unit connected to the plurality of data lines; and
   a scanning driving unit connected to the plurality of scanning lines,
   wherein the pixel circuit includes:
      an electro-optic element driven by a current; and
      a driving transistor that is provided in series with the electro-optic element and that controls a driving current to be supplied to the electro-optic element, in accordance with a voltage supplied via the data line,
   the scanning driving unit makes each of the scanning lines correspond to any one of one or more blocks, and provides, for each block, a common selection period for selecting a whole or a part of scanning lines corresponding to the block, and a scanning period for sequentially selecting the scanning lines corresponding to the block,
   the data driving unit includes:
      a detecting unit that detects a characteristic of the driving transistor via the data line from a pixel circuit corresponding to a scanning line which is being selected in the common selection period; and
      a correction output unit that supplies to the data line a voltage obtained by correcting a data voltage indicating gradation data, based on a characteristic of the driving transistor detected by the detecting unit in the common selection period immediately before the scanning period, and
   the scanning driving unit sequentially shifts each block in a unit of scanning lines whose number is smaller than a maximum number of scanning lines corresponding to each block, in each period of a length not smaller than one frame period as a length approximately equal to a sum of the common selection period and the scanning period that are provided in each block.

2. The display device according to claim 1, wherein
   the scanning driving unit makes each of the scanning lines correspond to any one of a plurality of blocks, and
   the scanning lines corresponding to each block are sequentially arranged in an extending direction of the data line.

3. The display device according to claim 1, wherein
   the scanning driving unit sequentially shifts, in the each one frame period, each block in a unit of scanning lines whose number is obtained by dividing a maximum number of scanning lines corresponding to each block by N, using N frame periods (N is an integer not smaller than two and smaller than a maximum number of scanning lines corresponding to each block) as one cycle.

4. The display device according to claim 1, wherein
each of the detecting unit and the correction output unit is provided for each of the data lines.

5. The display device according to claim 1, wherein
each of the detecting unit and the correction output unit is provided for each predetermined number of two or more data lines, and
the display device further comprises a selector for connecting each of the detecting unit and the correction output unit to the predetermined number of data lines.

6. The display device according to claim 1, wherein
the driving transistor is a thin-film transistor having a channel layer formed of an oxide semiconductor.

7. The display device according to claim 1, wherein
an annealing process using laser light is performed to the driving transistor at a time of forming the driving transistor, and
the extending direction of the data line is along a direction of each scanning of the laser light in the annealing process.

8. The display device according to claim 1, wherein
the pixel circuit further includes:
    an input transistor that has a control terminal connected to the scanning line, and that becomes in an on state when the scanning line is being selected; and
    a driving capacitor element that holds a voltage corresponding to a voltage supplied via the data line; and
    a light emission control transistor that is provided in series with the electro-optic element, and that becomes in an off state at least when a scanning line corresponding to the pixel circuit is being selected,
the driving transistor controls the driving current corresponding to a voltage held by the driving capacitor element,
the detecting unit includes a correction capacitor element charged to a correction voltage corresponding to a characteristic of the driving transistor in the common selection period, and
the correction output unit supplies to the data line a voltage that is obtained by adding to the data voltage or by subtracting from the data voltage the correction voltage held by the correction capacitor element in the scanning period.

9. The display device according to claim 8, wherein
a pixel circuit corresponding to a scanning line selected in the common selection period supplies a voltage corresponding to a threshold voltage of the driving transistor, from the input transistor in an on state to the detecting unit via the data line, and
the detecting unit gives, to one end of the correction capacitor element, a voltage supplied from the pixel circuit corresponding to the scanning line selected in the common selection period, and gives a first fixed voltage to the other end of the correction capacitor element.

10. The display device according to claim 9, wherein
the detecting unit further includes a detection switch unit that connects the one end of the correction capacitor element to the data line and that gives the first fixed voltage to the other end of the correction capacitor element, in a detection period within the common selection period, and
the correction output unit includes:
    a buffer amplifier having an input terminal connected to the one end of the correction capacitor element; and
    a correction output switch unit that gives the data voltage to the other end of the correction capacitor element of the detecting unit, and that connects an output terminal of the buffer amplifier to the data line, in the scanning period.

11. The display device according to claim 10, wherein
the data driving unit further includes a fixed voltage supply unit that is provided in each of the data lines, and that supplies a second fixed voltage to the data line in the common selection period and before the detection period.

12. The display device according to claim 8, wherein
a pixel circuit corresponding to a scanning line selected in the common selection period supplies a driving current that flows to the driving transistor, from the input transistor in an on state to the detecting unit via the data line, and
the detecting unit gives, to one end of the correction capacitor element, a voltage corresponding to a threshold voltage of the driving transistor obtained based on the driving current supplied from the pixel circuit corresponding to the scanning line selected in the common selection period, and gives a first fixed voltage to the other end of the correction capacitor element.

13. The display device according to claim 12, wherein
the detecting unit and the correction output unit include in common:
    an operational amplifier having a inverting input terminal connected to the data line; and
    a control switch that is provided between the inverting input terminal and an output terminal of the operational amplifier, and that is opened in the common selection period and is closed in the scanning period,
the detecting unit further includes:
    a diode element that is provided in parallel with the control switch between the inverting input terminal and the output terminal of the operational amplifier; and
    a detection switch unit that connects the one end of the correction capacitor element to the output terminal of the operational amplifier, that gives the first fixed voltage to the other end of the correction capacitor element, and that gives a second fixed voltage to the non-inverting input terminal of the operational amplifier, in the common selection period, and
the correction output unit further includes a correction output switch unit that gives the data voltage to the one end of the correction capacitor element, and that connects the other end of the correction capacitor element to the non-inverting input terminal of the operational amplifier, in the scanning period.

14. The display device according to claim 13, wherein
when the number of scanning lines corresponding to one block is k, a current supply capacity of the diode element is approximately equal to k times of a current supply capacity of the driving transistor.

15. The display device according to claim 14, wherein
the driving transistor is a thin-film transistor, and
the diode element is configured by a MOSFET with an aspect ratio smaller than that of the driving transistor.

16. A driving method of an active matrix-type display device, the device including a display unit including a plurality of data lines, a plurality of scanning lines, and a plurality of pixel circuits disposed corresponding to the plurality of data lines and the plurality of scanning lines; a data driving unit connected to the plurality of data lines; and a scanning driving unit connected to the plurality of scanning lines, the pixel circuit including an electro-optic element driven by a current; and a driving transistor that is provided in series with the electro-optic element and that controls a driving current to be supplied to the electro-optic element, in accordance with a voltage supplied via the data line, the driving method comprising:

- a scanning driving step for driving the plurality of scanning lines, by making each scanning line correspond to any one of one or more blocks, and by providing, for each block, a common selection period for selecting a whole or a part of scanning lines corresponding to the block, and a scanning period for sequentially selecting scanning lines corresponding to the block;
- a detecting step for detecting a characteristic of the driving transistor via the data line from a pixel circuit corresponding to a scanning line which is being selected in the common selection period; and
- a correction output step for supplying to the data line a voltage obtained by correcting a data voltage indicating gradation data, based on a characteristic of the driving transistor detected through the detecting step in the common selection period immediately before the scanning period,
- wherein in the scanning driving step, each block is sequentially shifted in a unit of scanning lines whose number is smaller than a maximum number of scanning lines corresponding to each block, in each period of a length not smaller than one frame period as a length approximately equal to a sum of the common selection period and the scanning period that are provided in each block.

17. The driving method according to claim 16, wherein
in the scanning driving step, each scanning line corresponds to any one of a plurality of the blocks, and
the scanning lines corresponding to each block are sequentially arranged in an extending direction of the data lines.

18. The driving method according to claim 16, wherein
in the scanning driving step, each block is sequentially shifted, in a unit of scanning lines whose number is obtained by dividing a maximum number of scanning lines corresponding to each block by N, using N frame periods (N is an integer not smaller than two and smaller than a maximum number of scanning lines corresponding to each block) as one cycle.

19. The driving method according to claim 16, wherein
in the detecting step, a characteristic of the driving transistor is detected via the data line from a pixel circuit corresponding to a scanning line which is being selected in the common selection period, for each of the data lines.

20. The driving method according to claim 16, wherein
in the detecting step, a characteristic of the driving transistor is detected via the data line from a pixel circuit corresponding to a scanning line which is being selected in the common selection period, for each of a predetermined number of two or more data lines.

* * * * *